United States Patent
Yaoi et al.

(10) Patent No.: US 7,064,982 B2
(45) Date of Patent: Jun. 20, 2006

(54) SEMICONDUCTOR MEMORY DEVICE AND PORTABLE ELECTRONIC APPARATUS

(75) Inventors: Yoshifumi Yaoi, Yamatokooriyama (JP); Hiroshi Iwata, Nara (JP); Akihide Shibata, Nara (JP); Yoshinao Morikawa, Ikoma (JP); Masaru Nawaki, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/844,562

(22) Filed: May 13, 2004

(65) Prior Publication Data

US 2004/0257875 A1    Dec. 23, 2004

(30) Foreign Application Priority Data

May 16, 2003    (JP) .............................. 2003-139053

(51) Int. Cl.
  *G11C 16/04*   (2006.01)
(52) U.S. Cl. ........................... 365/185.18; 365/185.23; 365/185.13
(58) Field of Classification Search ........... 365/185.18, 365/185.23, 185.13
  See application file for complete search history.

(56) References Cited

U.S. PATENT DOCUMENTS 5,835,409 A  * 11/1998  Lambertson ........... 365/185.18
5,978,263 A     11/1999  Javanifard et al.
6,195,291 B1 *  2/2001  Dallabora et al. ..... 365/185.23

FOREIGN PATENT DOCUMENTS

| JP | 5-81072   | B2 | 11/1993 |
| JP | 5-304277  | A  | 11/1993 |
| JP | 9-97849   | A  | 4/1997  |
| JP | 9-116119  | A  | 5/1997  |
| JP | 2001-156188 | A | 6/2001 |
| JP | 2001-230332 | A | 8/2001 |
| JP | 2001-512290 | A | 8/2001 |

* cited by examiner

*Primary Examiner*—Huan Hoang
(74) *Attorney, Agent, or Firm*—Birch, Stewart, Kolasch & Birch, LLP

(57) ABSTRACT

A semiconductor memory device includes a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges; a switching transistor circuit including a negative voltage switching circuit for applying a negative voltage to the gate electrode of the memory cell, and a switching transistor connected to an output of the negative voltage switching circuit and a first voltage source for outputting a voltage having a voltage level lower than zero volt; a pull-up circuit connected to a control terminal of the switching transistor and selectively connected to a second voltage source for outputting a voltage having a voltage level higher than zero volt; and a pull-down circuit connected to the first voltage source and the control terminal of the switching transistor.

24 Claims, 19 Drawing Sheets

SEMICONDUCTOR MEMORY DEVICE AND PORTABLE ELECTRONIC APPARATUS

CROSS-REFERENCE TO RELATED APPLICATION

This application is related to Japanese patent application No. 2003-139053 filed on May 16, 2003 whose priority is claimed under 35 USC § 119, the disclosure of which is incorporated by reference in its entirety.

BACKGROUND OF THE INVENTION

1. Field of the Invention

The present invention relates to a semiconductor memory device, in which a nonvolatile memory is used, and a portable electronic apparatus. More specifically, the present invention relates to a semiconductor memory device including a negative voltage switching circuit.

2. Description of the Related Art

Conventionally, a flash memory is typically used as a nonvolatile memory.

In a flash memory, as shown in FIG. 28, a floating gate 902, an insulating film 907 and a word line (control gate) 903 are formed in this order on a semiconductor substrate 901 via a gate insulating film. On both sides of the floating gate 902, a source line 904 and a bit line 905 are formed by a diffusion region, thereby constructing a memory cell. A device isolation region 906 is formed around the memory cell (see, for example, Japanese Unexamined Patent Publication No. Hei 5-304277 (1993)).

The memory cell retains data according to a charge amount in the floating gate 902. In a memory cell array constructed by arranging memory cells, an operation of rewriting/reading a desired memory cell can be performed by selecting a specific word line and a specific bit line and applying a predetermined voltage.

In such a flash memory, when a charge amount in the floating gate changes, a drain current (Id)-gate voltage (Vg) characteristic as shown in FIG. 29 is displayed. When the amount of negative charges in the floating gate increases, the threshold increases, and an Id-Vg curve shifts almost in parallel in the direction of increasing Vg.

In such a flash memory, however, it is necessary to dispose the insulating film 907 for separating the floating gate 902 and the word line 903 from the functional viewpoint. In addition, in order to prevent leakage of charges from the floating gate 902, it is difficult to reduce the thickness of the gate insulating film. It is therefore difficult to effectively reduce the thickness of the insulating film 907 and the gate insulating film, and it disturbs reduction in size of the memory cell.

SUMMARY OF THE INVENTION

The present invention provide, in its various embodiments, a semiconductor memory device including a memory cell which can be easily fined, a method for driving the semiconductor memory device, and a portable electronic apparatus.

Disclosed herein is a semiconductor memory device including: a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges; a switching transistor circuit including a negative voltage switching circuit for applying a negative voltage to the gate electrode of the memory cell, and a switching transistor connected to an output of the negative voltage switching circuit and a first voltage source for outputting a voltage having a voltage level lower than zero volt; a pull-up circuit connected to a control terminal of the switching transistor and selectively connected to a second voltage source for outputting a voltage having a voltage level higher than zero volt; and a pull-down circuit connected to the first voltage source and the control terminal of the switching transistor, wherein the pull-up circuit is configured in such a manner as to connect the second voltage source to the control terminal of the switching transistor when the pull-up circuit is connected to the second voltage source and the switching transistor does not connect the first voltage source to the output of the negative voltage switching circuit, and the pull-down circuit is configured in such a manner as to connect the output of the first voltage source to the control terminal of the switching transistor when the pull-up circuit is not connected to the second voltage source and the switching transistor connects the first voltage source to the output of the negative voltage switching circuit.

According to an embodiment the present invention, since erasure can be carried out by applying the negative voltage to the gate electrode of the memory cell, it is possible to reduce the number of devices in the semiconductor memory device or save electric power consumption.

In the voltage switching circuit according to an embodiment of the present invention, the first voltage source may output a voltage of −1 to −6 V, and the second voltage source may output a voltage of 1 to 6 V.

The switching transistor may be a P-channel transistor.

The pull-up circuit may include: a first transistor having a first terminal connected to the control terminal of the switching transistor and a second terminal selectively connected to the second voltage source and a ground; a voltage pump, connected to a control terminal of the first transistor, for applying a third voltage having a voltage level lower than zero volt to the control terminal of the first transistor; and a first resistor, connected to ground, the voltage pump and the control terminal of the first transistor, for connecting the ground to the control terminal of the first transistor when the voltage pump does not apply the third voltage to the control terminal of the first transistor, wherein the first transistor is turned off when the first terminal and control terminal of the first transistor are grounded, so that the pull-down circuit connects the first voltage source to the control terminal of the switching transistor.

The pull-up circuit may further include a switching circuit for connecting the second voltage to a second terminal of the first transistor under control of a control signal.

The first transistor may be a P-channel transistor, and the first resistor may be a polysilicon resistor.

The pull-down circuit may further include: a second resistor connected to the first voltage source and the control terminal of the switching transistor; and a second transistor, connected in parallel to the second resistor and connected to the control terminal of the switching transistor and the first voltage source, for allowing the first voltage source to bypass the second resistor of the pull-down circuit when turned on.

The second transistor may be a P-channel transistor, and the second resistor may be a polysilicon resistor.

Also provided is a semiconductor memory device including: a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges; a word line connected to the gate electrode of the memory cell; and a negative voltage switching circuit, connected to the word line, for connecting a first voltage having a voltage level lower than zero volt to the gate electrode of the memory cell during an erasing period of the memory cell, wherein the negative voltage switching circuit includes: a switching transistor connected to the word line and a first voltage source; a pull-up circuit, connected to a control terminal of the switching transistor and selectively connected to a second voltage source having a voltage level higher than zero volt, for connecting the second voltage source to a control terminal of the switching transistor when the pull-up circuit is connected to the second voltage source such that the switching transistor does not connect the first voltage source to the gate electrode of the memory cell via the word line; and a pull-down circuit, connected to the first voltage source and the control terminal of the switching transistor, for connecting the first voltage source to the control terminal of the switching transistor when the pull-up circuit is not connected to the second voltage source such that the switching transistor connects the first voltage source to the memory cell via the word line.

In the semiconductor memory device according to an embodiment of the present invention, the first voltage source may output a voltage of −1 to −6 V, and the second voltage source may output a voltage of 1 to 6 V.

The switching transistor may be a P-channel transistor.

The pull-up circuit may include: a first transistor having a first terminal connected to the control terminal of the switching transistor and a second terminal selectively connected to the second voltage source and ground; a voltage pump, connected to a control terminal of the first transistor, for applying a third voltage having a voltage level lower than zero volt, to the control terminal of the first transistor; and a first resistor, connected to ground, the voltage pump and the control terminal of the first transistor, for connecting ground to the control terminal of the first transistor when the voltage pump does not apply the third voltage to the control terminal of the first transistor, wherein the first transistor is turned off when the first terminal and control terminal of the first transistor are grounded, so that the pull-down circuit connects the first voltage source to the control terminal of the switching transistor.

The pull-up circuit may further include a switching circuit for connecting the second voltage to the second terminal of the first transistor under control of a control signal.

The first transistor may be a P-channel transistor, and the first resistor may be a polysilicon resistor.

The pull-down circuit may further include: a second resistor connected to the first voltage source and the control terminal of the switching transistor; and a second transistor, connected in parallel to the second resistor and connected to the control terminal of the switching transistor and the first voltage source, for allowing the first voltage source to bypass the second resistor of the pull-down circuit when turned-on.

The second transistor may be a P-channel transistor, and the second resistor may be a polysilicon resistor.

Also provided is a semiconductor memory device including: a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode and having a function of retaining charges; a voltage switching circuit for applying a voltage to the gate electrode of the memory cell; a switching transistor connected to an output of the voltage switching circuit and a first voltage source having a voltage level lower than zero volt; a first transistor, connected to a control terminal of the switching transistor and selectively connected to a second voltage source having a voltage level higher than zero volt, for connecting the second voltage source to the control terminal of the switching transistor when the switching transistor is connected to the second voltage source such that the switching transistor does not connect the first voltage source to the output; and a first resistor, connected to the first voltage source and the control terminal of the switching transistor, for connecting the first voltage source to the control terminal of the switching transistor when the switching transistor is not connected to the second voltage source such that the switching transistor connects the first voltage source to the output.

The semiconductor memory device may further include a second resistor connected to ground and the control terminal of the first transistor; and a voltage pump, connected to the control terminal of the first transistor, for applying a third voltage having a voltage level lower than zero volt to the control terminal of the first transistor, wherein the second resistor allows the control terminal to be grounded when the voltage pump does not apply the third voltage to the control terminal of the first transistor.

The semiconductor memory device may further include a second transistor connected in parallel to the first resistor and connected to the switching transistor and the first voltage source, wherein the second transistor allows the first voltage source to bypass the first resistor when turned-on.

Each of the first and second resistors may be a polysilicon resistor, each of the first and second transistors may be a P-channel transistor, and the switching transistor may be a P-channel transistor.

The semiconductor memory device may further include a switching circuit for connecting the second voltage source to the first transistor under control of a control signal.

The memory cell may include a film having a surface substantially in parallel to the surface of the gate insulating film for retaining charges, and an insulating film for separating the film from the channel region or the semiconductor layer, wherein the insulating film has a thickness thinner than the gate insulating film and not thinner than 0.8 nm.

The semiconductor layer of the memory cell may include a region of a higher concentration in the vicinity of the diffusion region than that of a region in the vicinity of the surface of the semiconductor layer under the gate electrode.

At least a part of the memory functional unit included in the memory cell may overlap a part of the diffusion region.

DETAILED DESCRIPTION OF THE INVENTION

Figure 1:
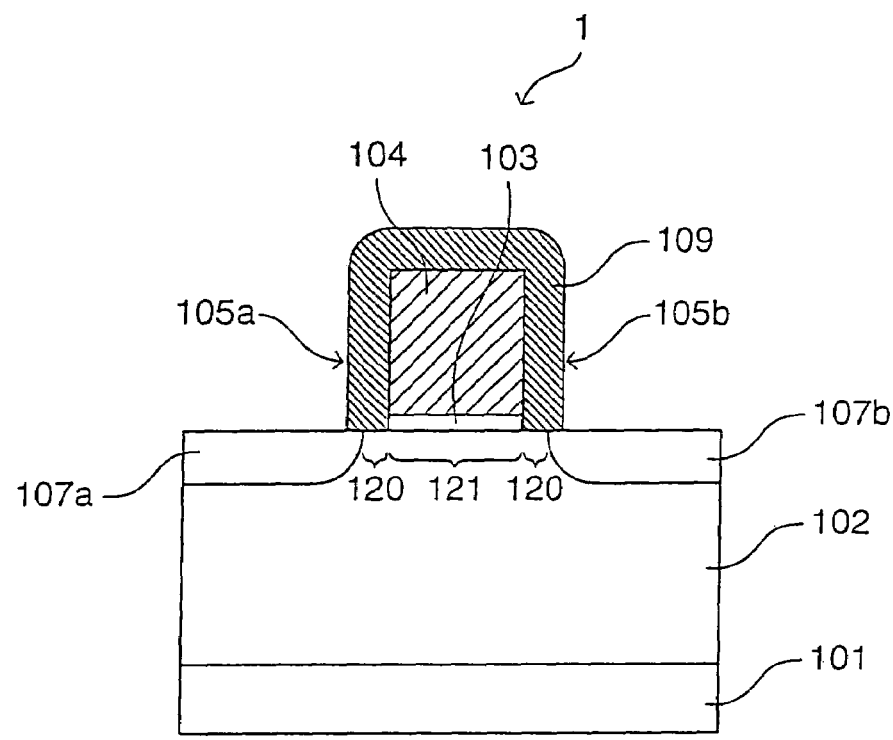
FIG. 1 is a schematic sectional view showing a main part of a memory cell (first embodiment) in a semiconductor memory device according to an embodiment of the present invention.

According to an embodiment of the present invention, the memory cell forming a memory array is mainly constructed by a semiconductor layer, a gate insulating film, a gate electrode, a channel region, a diffusion region and a memory functional unit. Herein, the channel region is normally a region of the same conductive type as that of the semiconductor layer and denotes a region immediately below the gate electrode. The diffusion region denotes a region of the conductive type opposite to that of the channel region.

Specifically, the memory cell according to an embodiment of the present invention may be constructed by a region of a first conductive type as a diffusion region, a region of a second conductive type as a channel region, a memory functional unit disposed across a border of the regions of the first and second conductive types, and an electrode provided via a gate insulating film. It is suitable that the memory cell of the present invention is constructed by a gate electrode formed on a gate insulating film, two memory functional units formed on both sides of the gate electrode, two diffusion regions disposed on the opposite sides of the gate electrode of the memory functional units, and a channel region disposed below the gate electrode.

In the semiconductor device of an embodiment of the present invention, the semiconductor layer is formed on the semiconductor substrate, preferably, on a well region of the first conductive type formed in the semiconductor substrate.

The semiconductor substrate is not particularly limited as long as it can be used for a semiconductor device, and an example thereof includes a bulk substrate made of an element semiconductor such as silicon, germanium or the like or a compound semiconductor such as silicon germanium, GaAs, InGaAs, ZnSe or GaN. As a substrate having a semiconductor layer on its surface, various substrates such as an SOI (Silicon on Insulator) substrate, an SOS substrate and a multilayer SOI substrate, or a glass or plastic substrate having thereon a semiconductor layer may be used. In particular, a silicon substrate and an SOI substrate having a semiconductor layer on its surface are preferable. The semiconductor substrate or semiconductor layer may be single crystal (formed by, for example, epitaxial growth), polycrystal, or amorphous although an amount of current flowing therein varies a little.

Preferably, a device isolation region is formed on the semiconductor layer. Further, a single layer or multilayer structure may be formed by a combination of devices such as a transistor, a capacitor and a resistor, a circuit formed by the devices, a semiconductor device, and an interlayer insulating film. The device isolation region can be formed by any of various device isolation films such as an LOCOS film, a trench oxide film and an STI film. The semiconductor layer may be of the P or N conductive type. In the semiconductor layer, preferably, at least one well region of the first conductive type (P or N type) is formed. As impurity concentration in the semiconductor layer and the well region, impurity concentration which is within a known range in this field can be used. In the case of using the SOI substrate as the semiconductor layer, the well region may be formed in the surface semiconductor layer and a body region may be provided below a channel region.

The gate insulating film is not particularly limited as long as it is usually used for a semiconductor device, and examples thereof include a single-layer film or a laminated film of an insulating film such as a silicon oxide film or a silicon nitride film, or a high dielectric constant film such as an aluminum oxide film, a titanium oxide film, a tantalum oxide film or a hafnium oxide film. Particularly, a silicon oxide film is preferable. The gate insulating film has a thickness of, for example, about 1 to 20 nm, preferably, about 1 to 6 nm. The gate insulating film may be formed only immediately below the gate electrode or formed so as to be larger (wider) than the gate electrode.

The gate electrode is formed in a shape which is usually used for a semiconductor device or a shape having a recess in a lower end portion on the gate insulating film. The gate electrode is formed preferably in an integral form without being separated by a single-layered or multilayer conductive film. The gate electrode may be disposed in a state where it is separated by a single-layered or multilayer conductive film. The gate electrode may have a side-wall insulating film on its sidewalls. Usually, the gate electrode is not particularly limited as long as it is used for a semiconductor device, and an example of thereof includes a conductive film, for example, a single-layered or multilayer film made of polysilicon, a metal such as copper or aluminum, a high-refractory metal such as tungsten, titanium or tantalum, and a silicide or the like with the high refractory metal. Suitable thickness of the gate electrode is, for example, about 50 to 400 nm. A channel region is formed below the gate electrode.

Preferably, the gate electrode is formed only on the sidewalls of the memory functional unit or does not cover the top part of the memory functional unit. A contact plug can be disposed closer to the gate electrode by such arrangement, so that reduction in the size of the memory cell is facilitated. It is easy to manufacture the memory cell having such simple arrangement, so that the yield can be improved.

The memory functional unit has at least the function of retaining charges (hereinafter, described as "charge retaining function"). In other words, the memory functional unit has the function of accumulating and retaining charges, the function of trapping charges or the function of holding a charge polarization state. The function is exhibited, for example, when the memory functional unit includes a film or region having the charge retaining function. Examples of elements having the above function include: silicon nitride; silicon; a silicate glass including impurity such as phosphorus or boron; silicon carbide; alumina; a high dielectric material such as hafnium oxide, zirconium oxide or tantalum oxide; zinc oxide; ferroelectric; metals, and the like. Therefore, the memory functional unit can be formed by, for example, a single-layered or laminated structure of: an insulating film including a silicon nitride film; an insulating film having therein a conductive film or a semiconductor layer; an insulating film including at least one conductor or semiconductor dot; or an insulating film including a ferroelectric film of which inner charge is polarized by an electric field and in which the polarized state is held. Particularly, the silicon nitride film is preferable for the reason that the silicon nitride film can obtain a large hysteretic characteristic since a number of levels of trapping charges exist. In addition, the charge retention time is long and a problem of charge leakage due to occurrence of a leak path does not occur, so that the retention characteristics are good. Further, silicon nitride is a material which is used as standard in an LSI process.

Reliability of storage and retention can be increased by using the insulating film including a film having the charge retaining function such as a silicon nitride film as the memory functional unit. Since the silicon nitride film is an insulator, even in the case where a charge leak occurs in part of the silicon nitride film, the charges in the whole silicon nitride film are not lost immediately. In the case of arranging a plurality of memory cells, even when the distance between the memory cells is shortened and neighboring memory cells come into contact with each other, unlike the case where the memory functional units are made of conductors, information stored in the memory functional units is not lost. Further, a contact plug can be disposed closer to the memory functional unit. In some cases, the contact plug can be disposed so as to be overlapped with the memory functional unit. Thus, reduction in size of the memory cell is facilitated.

The film having the charge retaining function does not always have to have a film shape in order to increase the reliability of storage and retention. Preferably, films having the charge retaining function exist discretely in an insulating film. Concretely, it is preferable that the films having the charge retaining function in the shape of dots be spread in a material which is hard to retain charges, for example, in a silicon oxide.

In the case of using a conductive film or semiconductor layer as the charge retaining film, preferably, the conductive film or semiconductor layer is disposed via an insulating film so that the charge retaining film is not in direct contact with the semiconductor layer (semiconductor substrate, well region, body region, source/drain regions or diffusion region) or a gate electrode. For example, a laminated structure of the conductive film and the insulating film, a structure in which conductive films in the form of dots are spread in the insulating film, a structure in which the conductive film is disposed in a part of a sidewall insulating film formed on sidewalls of the gate, and the like can be mentioned.

It is preferable to use the insulating film having therein the conductive film or semiconductor layer as a memory functional unit for the reason that an amount of injecting charges into the conductor or semiconductor can be freely controlled and multilevel values can be easily obtained.

Further, it is preferable to use the insulating film including at least one conductor or semiconductor dot as the memory functional unit for the reason that it becomes easier to perform writing and erasing by direct tunneling of charges, and reduction in power consumption can be achieved.

Alternately, a ferroelectric film such as PZT or PLZT in which the polarization direction changes according to the electric field may be used as a memory functional unit. In this case, charges are substantially generated in the surface of the ferroelectric film by the polarization and are held in that state. It is therefore preferable since the ferroelectric film can obtain a hysteresis characteristic similar to that of a film to which charges are supplied from the outside of the film having the memory function and which traps charges. In addition, it is unnecessary to inject charges from the outside of the film in order to retain charges in the ferroelectric film, and the hysteresis characteristic can be obtained only by the polarization of the charge in the film, so that writing/erasing can be performed at high speed.

A film having a region or function of suppressing escape of charges is suitable as the insulating film constructing the memory functional unit. An example of a film having the function of suppressing escape of charges includes a silicon oxide film.

The charge retaining film included in the memory functional unit is disposed on both sides of the gate electrode directly or via an insulating film, and is disposed on the semiconductor layer (semiconductor substrate, well region, body region or source/drain region, or diffusion region) directly or via a gate insulating film. Preferably, the charge retaining film on both sides of the gate electrode is formed so as to cover all or part of the sidewalls of the gate electrode directly or via the insulating film. In an application example, in the case where the gate electrode has a recess in its lower end, the charge retaining film may be formed so as to completely or partially bury the recess directly or via an insulating film.

The diffusion regions can function as source and drain regions and have the conductive type opposite to that of the semiconductor layer or well region. In the junction between the diffusion region and the semiconductor layer or well region, preferably, impurity concentration is high for the reason that hot electrons or hot holes are generated efficiently with low voltage, and high-speed operation can be performed with lower voltage. The junction depth of the diffusion region is not particularly limited but can be appropriately adjusted in accordance with the performance or the like of a semiconductor memory device to be obtained. In the case of using an SOI substrate as a semiconductor substrate, the diffusion region may have a junction depth smaller than the thickness of the surface semiconductor layer. It is preferable that the diffusion region has junction depth almost the same as that of the surface semiconductor layer.

The diffusion region may be disposed so as to overlap with an end of the gate electrode, so as to match an end of the gate electrode, or so as to be offset from an end of the gate electrode. The case of offset is particularly preferable because easiness of inversion of the offset region below the charge retaining film largely changes in accordance with an amount of charges accumulated in the memory functional unit when voltage is applied to the gate electrode, the memory effect increases, and a short channel effect is reduced. However, when the diffusion region is offset too much, drive current between the diffusion regions (source and drain) decreases conspicuously. Therefore, it is preferable that the offset amount, that is, the distance to the diffusion area closer to one of the gate electrode ends in the gate length direction is shorter than the thickness of the charge retaining film extending in the direction parallel with the gate length direction. It is particularly preferable that at least a part of the film or region having the charge retaining function in the memory functional unit is overlapped with part of the diffusion region. This is because the essence of the memory cell as a component of the semiconductor memory device is to rewrite stored information by an electric field which is applied across the memory functional unit in accordance with the voltage difference between the gate electrode which exists only in the sidewall part of the memory functional unit and the diffusion region.

A part of the diffusion region may extend at a level higher than the surface of the channel region or the under face of the gate insulating film. In this case, it is suitable that, on the diffusion region formed in the semiconductor substrate, the conductive film integrated with the diffusion region is laminated. The conductive film is made of semiconductor such as polysilicon or amorphous silicon, silicide, the above-described metals, high-refractory metals, or the like. In particular, polysilicon is preferred. Since impurity diffusion speed of polysilicon is much faster than that of the semiconductor layer, it is easy to make the junction depth of the diffusion region in the semiconductor layer shallow and to suppress the short channel effect. In this case, preferably, a part of the diffusion region is disposed so as to sandwich at least a part of the memory functional unit in cooperation with the gate electrode.

The memory cell of an embodiment of the present invention can be formed by a normal semiconductor process, for example, a method similar to the method of forming the sidewall spacer having the single-layer or laminated structure on the sidewalls of the gate electrode. Concrete examples of the method include; a method of forming the gate electrode, after that, forming a single-layer film or laminated film including the charge retaining film such as a film having the function of retaining charges (hereinafter, described as "charge retaining film"), charge retaining film/ insulating film, insulating film/charge retaining film, or insulating film/charge retaining film/insulating film, and etching back the formed film under suitable conditions so as to leave the films in a sidewall spacer shape; a method of forming an insulating film or charge retaining film, etching back the film under suitable conditions so as to leave the film in the sidewall spacer shape, further forming the charge retaining film or insulating film, and similarly etching back the film so as to leave the film in the sidewall spacer shape; a method of applying or depositing an insulating film material in which particles made of a charge retaining material are spread on the semiconductor layer including the gate electrode and etching back the material under suitable conditions so as to leave the insulating film material in a sidewall spacer shape; and a method of forming a gate electrode, after that, forming the single-layer film or laminated film, and patterning the film with a mask. According to another method, before the gate electrode is formed, charge retaining film, charge retaining film/insulating film, insulating film/charge retaining film, insulating film/charge retaining film/insulating film, or the like is formed. An opening is formed in a region which becomes the channel region of the films, a gate electrode material film is formed on the entire surface of the opening, and the gate electrode material film is patterned in a shape including the opening and larger than the opening, thereby forming the gate electrode and the memory functional unit.

One example of a method for forming the memory cell according to an embodiment of the present invention will now be described.

First, the gate insulating film and the gate electrode are formed on the semiconductor substrate in accordance with known procedures. Subsequently, a silicon oxide film having a thickness of 0.8 to 20 nm, more preferably 3 to 10 nm is formed by thermal oxidation or deposited by CVD (Chemical Vapor Deposition) over the entire semiconductor substrate. Next, a silicon nitride film having a thickness of 2 to 15 nm, more preferably 3 to 10 nm is deposited by the CVD over the entire silicon oxide film. Moreover, another silicon oxide film having a thickness of 20 to 70 nm is deposited by the CVD over the entire silicon nitride film.

Subsequently, the silicon oxide film/silicon nitride film/silicon oxide film are etched back by anisotropic etching, thereby forming the memory functional unit optimum for storing data on the sidewall of the gate electrode in the form of a sidewall spacer.

Thereafter, ions are injected while using the gate electrode and the memory functional unit in the form of the sidewall spacer as masks, thereby forming a diffusion layer region (source/drain region). After that, a silicide process or an upper wiring process may be performed in accordance with known procedures.

In the case of constructing the memory cell array by arranging memory cells of the present invention, the best mode of the memory cell satisfies all of the requirements: for example, (1) the gate electrodes of a plurality of memory cells are integrated and have the function of a word line; (2) the memory functional units are formed on both sides of the word line; (3) an insulator, particularly, a silicon nitride film retains charges in the memory functional unit; (4) the memory functional unit is constructed by an ONO (Oxide Nitride Oxide) film and the silicon nitride film has a surface substantially parallel with the surface of the gate insulating film; (5) a silicon nitride film in the memory functional unit is isolated from a word line and a channel region via a silicon oxide film; (6) the silicon nitride film and a diffusion region in the memory functional unit are overlapped; (7) the thickness of the insulating film separating the silicon nitride film having the surface which is substantially parallel with the surface of the gate insulating film from the channel region or semiconductor layer and the thickness of the gate insulating film are different from each other; (8) an operation of writing/erasing one memory cell is performed by a single word line; (9) there is no electrode (word line) having the function of assisting the writing/erasing operation on the memory functional unit; and (10) in a portion in contact with the diffusion region immediately below the memory functional unit, a region of high concentration of impurity whose conductive type is opposite to that of the diffusion region is provided. Benefits are also obtained when fewer than all ten requirements are satisfied. It is sufficient for the memory cell to satisfy even one of the requirements.

A particularly preferable combination of the requirements is, for example, (3) an insulator, particularly, a silicon nitride film retains charges in the memory functional unit, (6) the insulating film (silicon nitride film) and the diffusion region in the memory functional unit are overlapped, and (9) there is no electrode (word line) having the function of assisting the writing/erasing operation on the memory functional unit.

In the case where the memory cell satisfies at least the requirements (3) and (9), it is very useful for the following reasons. First, the bit line contact can be disposed closer to the memory functional unit-on the word line sidewall or even when the distance between memory cells is shortened, a plurality of memory functional units do not interfere with each other, and stored information can be held. Therefore, reduction in size of the memory cell is facilitated. In the case where the charge retaining region in the memory functional unit is made of a conductor, as the distance between memory cells decreases, interference occurs between the charge retaining regions due to capacitive coupling, so that stored information cannot be held.

In the case where the charge retaining region in the memory functional unit is made of an insulator (for example, a silicon nitride film), it becomes unnecessary to make the memory functional unit independent for each memory cell. For example, the memory functional units formed on both sides of a single word line shared by a plurality of memory cells do not have to be isolated for each memory cell. The memory functional units formed on both sides of one word line can be shared by a plurality of memory cells sharing the word line. Consequently, a photo etching process for isolating the memory functional unit becomes unnecessary, and the manufacturing process is simplified.

Further, a margin for positioning in the photolithography process and a margin for film reduction by etching become unnecessary, so that the margin between neighboring memory cells can be reduced. Therefore, as compared with the case where the charge retaining region in the memory functional unit is made of a conductor (for example, polysilicon film), even when the memory functional unit is formed at the same microfabrication level, a memory cell occupied area can be reduced. In the case where the charge retaining region in the memory functional unit is made of a conductor, the photo etching process for isolating the memory functional unit for each memory cell is preferable, and a margin for positioning in the photolithography process and a margin for film reduction by etching are preferable.

Moreover, since the electrode having the function of assisting the writing and erasing operations does not exist on the memory functional unit and the device structure is simple, the number of processes decreases, so that the yield can be increased. Therefore, it facilitates formation with a transistor as a component of a logic circuit or an analog circuit, and a cheap semiconductor memory device can be obtained.

In the case where not only the requirements (3) and (9) but also the requirement (6) are satisfied, additional benefits are obtained.

Specifically, by overlapping the charge retaining region in the memory functional unit and the diffusion region, writing and erasing can be performed with a very low voltage. Concretely, with a low voltage of 5 V or less, the writing and erasing operations can be performed. The action is a very large effect also from the viewpoint of circuit designing. Since it is unnecessary to generate a high voltage in a chip unlike a flash memory, a charge pumping circuit requiring a large occupation area can be omitted or its scale can be reduced. Particularly, when a memory of small-scale capacity is provided for adjustment in a logic LSI, as for an occupied area in a memory part, an occupation area of peripheral circuits for driving a memory cell is dominant more than that of a memory cell. Consequently, omission or down sizing of the charge pumping circuit for a memory cell is most effective to reduce the chip size.

On the other hand, in the case where the requirement (3) is not satisfied, that is, in the case where a conductor retains charges in the memory functional unit, even when the requirement (6) is not satisfied, specifically, even when the conductor in the memory functional unit and the diffusion region do not overlap with each other, writing operation can be performed. This is because that the conductor in the memory functional unit assists writing operation by capacitive coupling with the gate electrode.

In the case where the requirement (9) is not satisfied, specifically, in the case where the electrode having the function of assisting the writing and erasing operations exists on the memory functional unit, even when the requirement (6) is not satisfied, specifically, even when the insulator in the memory functional unit and the diffusion region do not overlap with each other, writing operation can be performed.

In the semiconductor memory device of an embodiment of the present invention, a transistor may be connected in series with one of or both sides of a memory cell, or the memory cell may be mounted on the same chip with a logic transistor. In such a case, the semiconductor device of an embodiment of the present invention, particularly, the memory cell can be formed by a process having high compatibility with a process of forming a normal standard transistor such as a transistor or a logic transistor, they can be formed simultaneously. Therefore, a process of forming both the memory cell and a transistor or a logic transistor is very simple and, as a result, a cheap embedded device can be obtained.

In the semiconductor memory device of an embodiment of the present invention, the memory cell can store information of two or more values in one memory functional unit. Thus, the memory cell can function as a memory cell for storing information of four or more values. The memory cell may store binary data only. The memory cell is also allowed to function as a memory cell having the functions of both a selection transistor and a memory transistor by a variable resistance effect of the memory functional unit.

The semiconductor memory device of an embodiment of the present invention can be widely applied by being combined with a logic device, a logic circuit or the like to: a data processing system such as a personal computer, a note-sized computer, a laptop computer, a personal assistant/transmitter, a mini computer, a workstation, a main frame, a multiprocessor/computer, a computer system of any other type, or the like; an electronic part as a component of the data processing system, such as a CPU, a memory or a data memory device; a communication apparatus such as a telephone, a PHS, a modem or a router; an image display apparatus such as a display panel or a projector; an office apparatus such as a printer, a scanner or a copier; an image pickup apparatus such as a video camera or a digital camera; an entertainment apparatus such as a game machine or a music player; an information apparatus such as a portable information terminal, a watch or an electronic dictionary; a vehicle-mounted apparatus such as a car navigation system or a car audio system; an AV apparatus for recording/reproducing information such as a motion picture, a still picture or music; an appliance such as a washing machine, a microwave, a refrigerator, a rice cooker, a dish washer, a vacuum cleaner or an air conditioner; a health managing apparatus such as a massage device, a bathroom scale or a manometer; and a portable memory device such as an IC card or a memory card. Particularly, it is effective to apply the semiconductor memory device to portable electronic apparatuses such as portable telephone, portable information terminal, IC card, memory card, portable computer, portable game machine, digital camera, portable motion picture player, portable music player, electronic dictionary and watch. The semiconductor memory device of an embodiment of the present invention may be provided as at least a part of a control circuit or a data storing circuit of an electronic device or, as necessary, detachably assembled.

DESCRIPTION OF THE PREFERRED EMBODIMENTS

Hereinafter, embodiments of the present invention will be described in detail with reference to the drawings.

First Embodiment

A semiconductor memory device of a first embodiment has a memory cell 1 as shown in FIG. 1.

The memory cell 1 has a gate electrode 104 formed on a P-type well region 102 formed on the surface of a semiconductor substrate 101 via a gate insulating film 103. On the top face and side faces of the gate electrode 104, a silicon nitride film 109 having a trap level of retaining charges and serving as a charge retaining film is disposed. In the silicon nitride film 109, parts of both sidewalls of the gate electrode 104 serve as memory functional units 105a and 105b for actually retaining charges. The memory functional unit refers to a part in which charges are actually accumulated by rewriting operation in the memory functional unit or the charge retaining film. In the P-type well region 102 on both sides of the gate electrode 104, N-type diffusion regions 107a and 107b functioning as a source region and a drain region, respectively, are formed. Each of the diffusion regions 107a and 107b has an offset structure. Specifically, the diffusion regions 107a and 107b do not reach a region 121 below the gate electrode 104, and offset regions 120 below the charge retaining film construct part of the channel region.

Figure 2A:
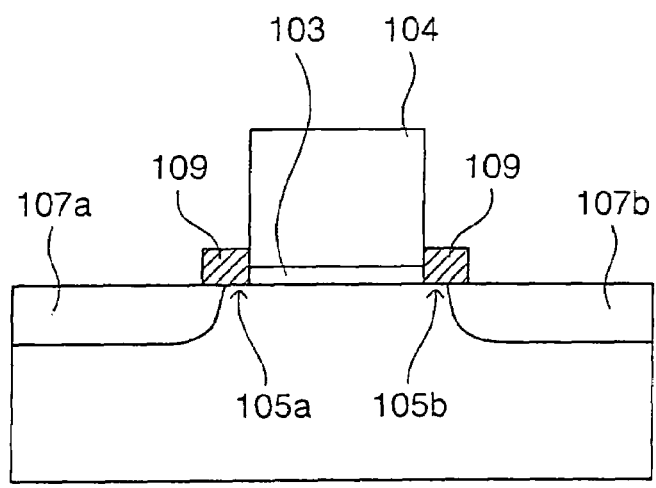
FIGS. 2A and 2B are schematic sectional views each showing a main part of a modification of the memory cell (first embodiment) in a semiconductor memory device according an embodiment of to the present invention.
Figure 2B:
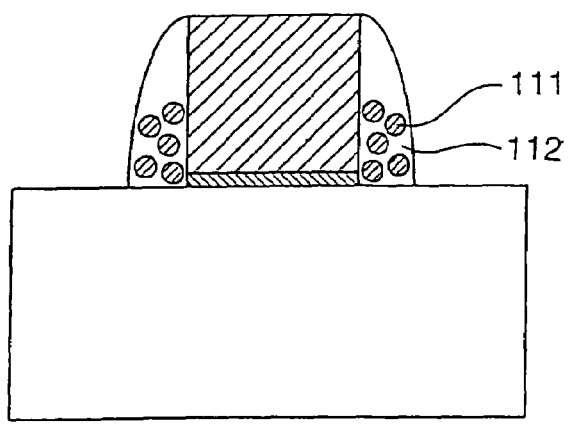

The memory functional units 105a and 105b for substantially retaining charges are the parts on both sidewalls of the gate electrode 104. It is therefore sufficient that the silicon nitride film 109 is formed only in regions corresponding to the parts (see FIG. 2A). Each of the memory functional units 105a and 105b may have a structure in which fine particles 111 each made of a conductor or semiconductor and having a nanometer size are distributed like discrete points in an insulating film 112 (see FIG. 2B). When the fine particle 111 has a size less than 1 nm, a quantum effect is too large, so that it becomes hard for charges to go through the dots. When the size exceeds 10 nm, a conspicuous quantum effect does not appear at room temperature. Therefore, the diameter of the fine particle 111 is preferably in a range from 1 nm to 10 nm. The silicon nitride film 109 serving as a charge retaining film may be formed in a sidewall spacer shape on a side face of the gate electrode (see FIG. 3).

The principle of the writing operation of the memory cell will be described with reference to FIGS. 3 and 4. The case where whole memory functional units 131a and 131b have the function of retaining charges will be described. "Writing" denotes herein injection of electrons into the memory functional units 131a and 131b when the memory cell is of the N channel type. Hereinafter, on assumption that the memory cell is of the N channel type, description will be given.

Figure 3:
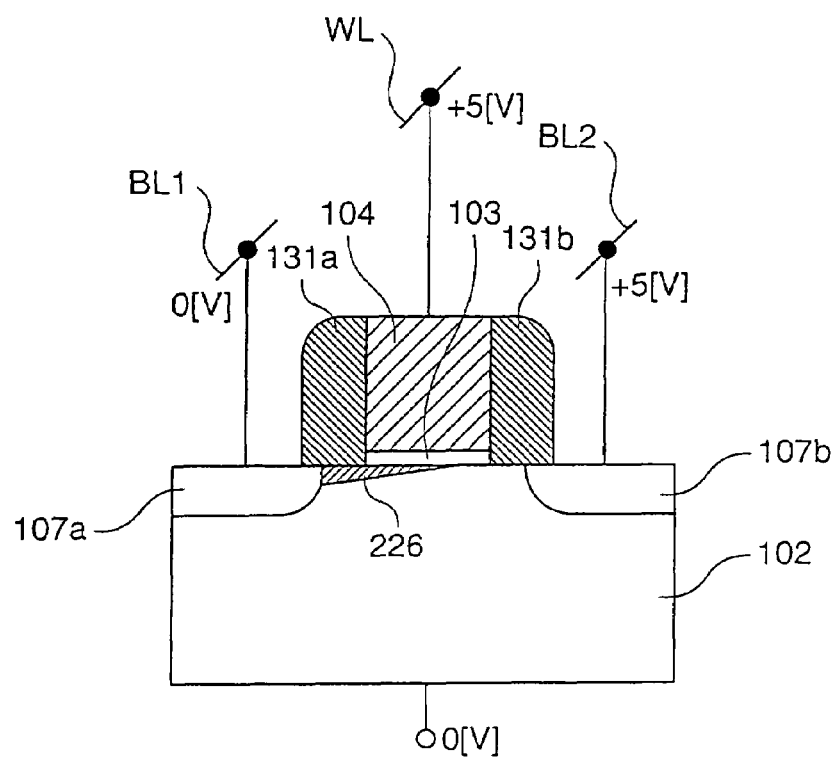
FIG. 3 is a diagram for describing a writing operation of the memory cell (first embodiment) in a semiconductor memory device according to an embodiment of the present invention.

In order to inject electrons (write) the second memory functional unit 131b, as shown in FIG. 3, the first diffusion region 107a of the N type is set as a source electrode, and the second diffusion region 107b of the N type is set as a drain electrode. For example, 0 V is applied to the first diffusion region 107a and the P-type well region 102, +5 V is applied to the second diffusion region 107b, and +5 V is applied to the gate electrode 104. Under such voltage parameters, an inversion layer 226 extends from the first diffusion region 107a (source electrode) but does not reach the second diffusion region 107b (drain electrode), and a pinch off point occurs. Electrons are accelerated from the pinch-off point to the second diffusion region 107b (drain electrode) by a high electric field, and become so-called hot electrons (high-energy conduction electrons). By injection of the hot electrons into the second memory functional unit 131b, writing is performed. Since hot electrons are not generated in the vicinity of the first memory functional unit 131a, writing is not performed.

Figure 4:
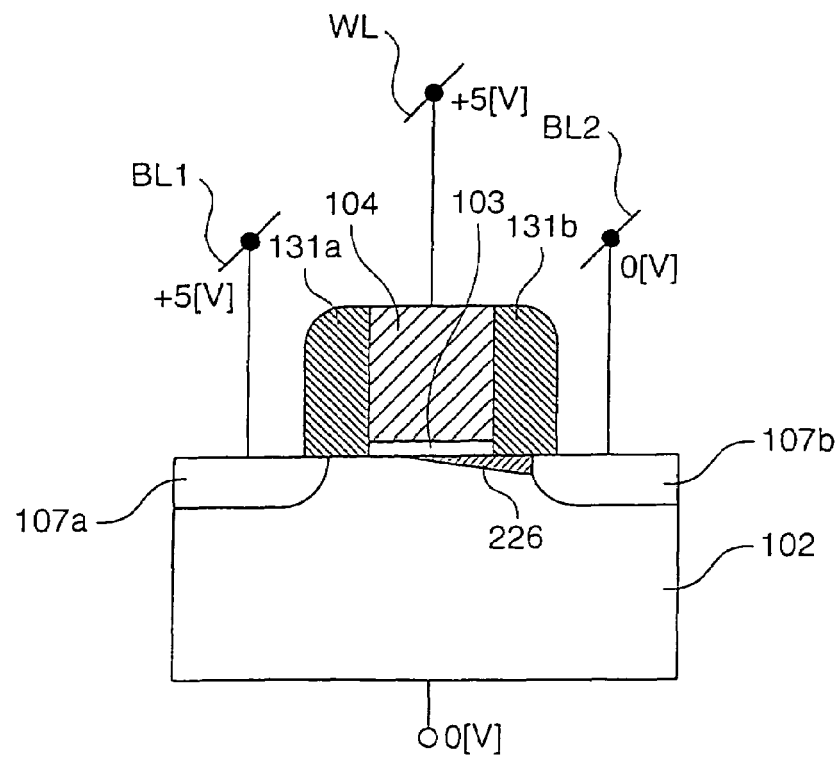
FIG. 4 is a diagram for describing a writing operation of the memory cell (first embodiment) in a semiconductor memory device according to an embodiment of the present invention.

On the other hand, in order to inject electrons (write) into the first memory functional unit 131a, as shown in FIG. 4, the second diffusion region 107a is set as the source electrode, and the first diffusion region 107a is set as the drain electrode. For example, 0 V is applied to the second diffusion region 107b and the P-type well region 102, +5 V is applied to the first diffusion region 107a, and +5 V is applied to the gate electrode 104. By interchanging the source and drain regions so as to be different from the case of injecting electrons into the second memory functional unit 131b, electrons are injected into the first memory functional unit 131a and writing can be performed.

The principle of erasing operation of the memory cell will now be described with reference to FIGS. 5 and 6.

Figure 5:
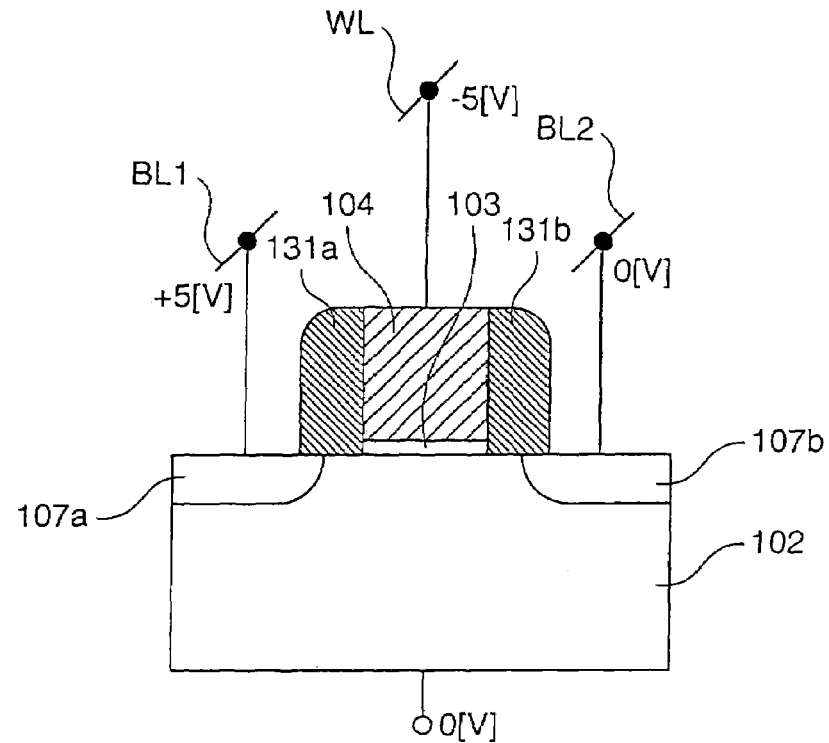
FIG. 5 is a diagram for describing an erasing operation of the memory cell (first embodiment) in a semiconductor memory device according to an embodiment of the present invention.

In a first method of erasing information stored in the first memory functional unit 131a, by applying positive voltage (for example, +5 V) to the first diffusion region 107a and applying 0 V to the P-type well region 102 as shown in FIG. 5, the PN junction between the first diffusion region 107a and the P-type well region 102 is reverse-biased and, further, negative voltage (for example, −5 V) is applied to the gate electrode 104. At this time, in the vicinity of the gate electrode 104 in the PN junction, due to the influence of the gate electrode to which the negative voltage is applied, particularly, gradient of potential becomes sharp. Consequently, hot holes (positive holes of high energy) are generated on the side of the P-type well region 102 of the PN junction by interband tunneling. The hot holes are attracted toward the gate electrode 104 having a negative potential and, as a result, the holes are injected to the first memory functional unit 131a. In such a manner, information in the first memory functional unit 131a is erased. At this time, to the second diffusion region 107b, it is sufficient to apply 0 V.

In the case of erasing information stored in the second memory functional unit 131b, the above-described operation is performed while interchanging the potential of the first diffusion region and that of the second diffusion region.

Figure 6:
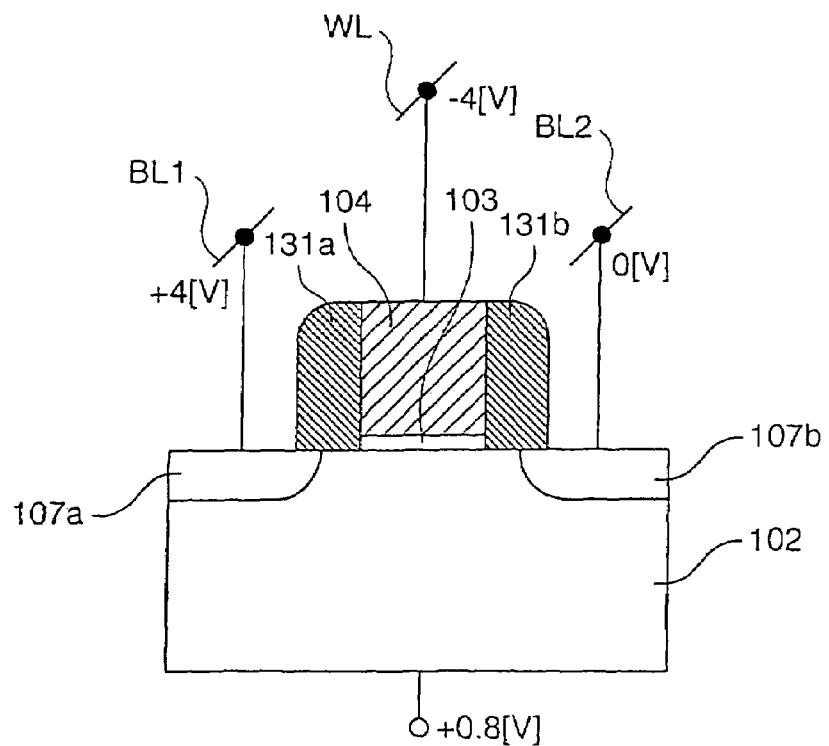
FIG. 6 is a diagram for describing an erasing operation of the memory cell (first embodiment) in a semiconductor memory device according to an embodiment of the present invention.

In a second method of erasing information stored in the first memory functional unit 131a, as shown in FIG. 6, positive voltage (for example, +4 V) is applied to the first diffusion region 107a, 0 V is applied to the second diffusion region 107b, negative voltage (for example, −4 V) is applied to the gate electrode 104, and positive voltage (for example, +0.8 V) is applied to the P-type well region 102. At this time, forward voltage is applied between the P-type well region 102 and the second diffusion region 107b, and electrons are injected to the P-type well region 102. The injected electrons are diffused to the PN junction between the P-type well region 102 and the first diffusion region 107a, where the electrons are accelerated by a strong electric field, thereby becoming hot electrons. By the hot electrons, an electron-hole pair is generated in the PN junction. Specifically, by applying forward voltage between the P-type well region 102 and the second diffusion region 107b, electrons injected in the P-type well region 102 become a trigger, and hot holes are generated in the PN junction positioned on the opposite side. The hot holes generated in the PN junction are attracted toward the gate electrode 104 having the negative potential and, as a result, positive holes are injected into the first memory functional unit 131a.

According to the method, also in the case where only voltage insufficient to generate hot holes by interband tunneling is applied to the PN junction between the P-type well region and the first diffusion region 107a, electrons injected from the second diffusion region 107b become a trigger to generate an electron-positive hole pair in the PN junction, thereby enabling hot holes to be generated. Therefore, voltage in the erasing operation can be decreased. Particularly, in the case where the offset region 120 (see FIG. 1) exists, an effect that the gradient of potential in the PN junction becomes sharp by the gate electrode to which the negative potential is applied is low. Consequently, although it is difficult to generate hot holes by interband tunneling, by the second method, the disadvantage is overcome and the erasing operation can realized with low voltage.

In the case of erasing information stored in the first memory functional unit 131a, +5 V has to be applied to the first diffusion region 107a in the first erasing method whereas +4 V is sufficient in the second erasing method. As described above, according to the second method, the voltage at the time of erasing can be decreased, so that power consumption can be reduced and deterioration of the memory cell due to hot carriers can be suppressed.

In any of the erasing methods, over-erasure does not occur easily in the memory cell. The over-erasure herein denotes a phenomenon that as the amount of positive holes accumulated in the memory functional unit increases, the threshold decreases without saturation. The over-erasure is a big issue in an EEPROM typified by a flash memory. Particularly, in the case where the threshold becomes negative, critical malfunctioning that selection of a memory cell becomes impossible occurs. On the other hand, in the memory cell in the semiconductor memory device of the present invention, also in the case where a large amount of positive holes are accumulated in the memory functional unit, only electrons are induced below the memory functional unit but an influence is hardly exerted to the potential in the channel region below the gate insulating film. Since the threshold at the time of erasing is determined by the potential below the gate insulating film, occurrence of over-erasure is suppressed.

The memory cell includes a gate electrode formed on a semiconductor layer via a gate insulating film, a channel region disposed under the gate electrode, diffusion regions disposed on both sides of the channel region, and functional units formed on both sides of the gate electrode and having the function of retaining charges. The memory functional units are separated by the gate electrode from each other. It is therefore easy to reduce the thickness of the gate insulating film as compared with the conventional flash memory. As a result, it is possible to easily apply an electric field, which is stronger than conventional one, from the gate electrode to the PN junction, and to realize a high-speed erasing operation with low voltage.

In addition, it is desired that a charge retaining region in the memory functional unit overlaps with the diffusion region. By overlapping the diffusion region with the charge retaining region in the memory functional unit, hot holes are generated in a first erasing method and distance between the PN junction, in which an electron-hole couple is generated in a second erasing method, and the charge retaining region becomes shorter, so that it is possible to realize a high-speed erasing operation with low voltage.

Figure 7:
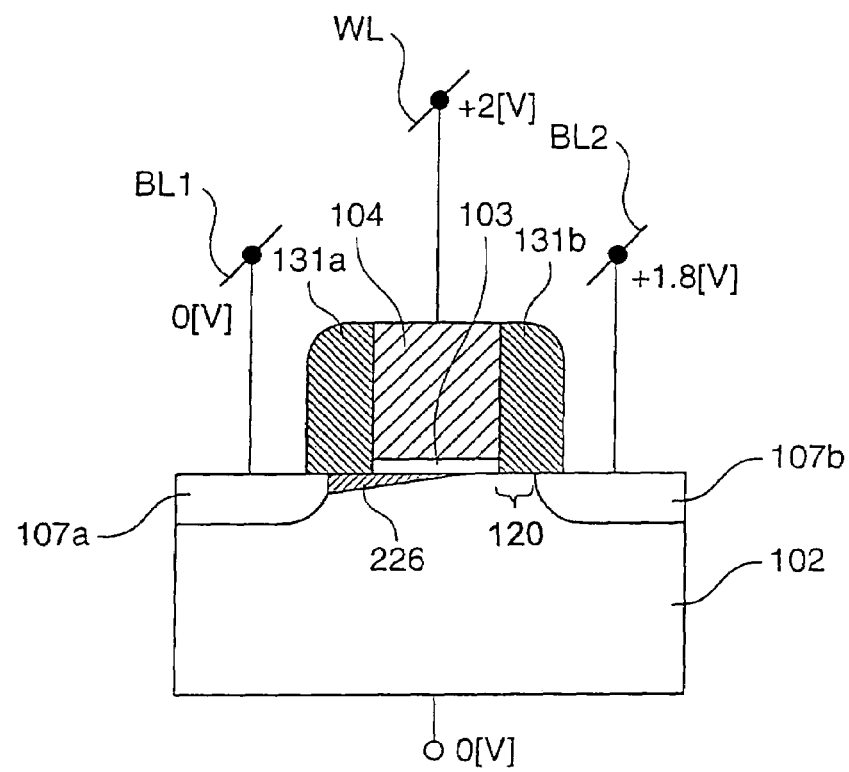
FIG. 7 is a diagram for describing a reading operation of the memory cell (first embodiment) in a semiconductor memory device according to an embodiment of the present invention.

Further, the principle of reading operation of the memory cell will be described with reference to FIG. 7.

In the case of reading information stored in the first memory functional unit 131a, the first diffusion region 107a is set as a source electrode, the second diffusion region 107b is set as a drain electrode, and the transistor is allowed to operate. For example, 0 V is applied to the first diffusion region 107a and the P-type well region 102, +1.8 V is applied to the second diffusion region 107b, and +2 V is applied to the gate electrode 104. In the case where electrons are not accumulated in the first memory functional unit 131a at this time, drain current is apt to flow. On the other hand, in the case where electrons are accumulated in the first memory functional unit 131a, an inversion layer is not easily formed in the vicinity of the first memory functional unit 131a, so that the drain current is not apt to flow. Therefore, by detecting the drain current, information stored in the first memory functional unit 131a can be read. In the case of applying a voltage so as to perform the pinch-off operation, thereby reading information, it is possible to determine with higher accuracy the state of charge accumulation in the first memory functional unit 131a without influence of the presence/absence of charge accumulation in the second memory functional unit 131b.

In the case of reading information stored in the second memory functional unit 131b, the second diffusion region 107b is set as a source electrode, the first diffusion region 107a is set as a drain electrode, and the transistor is operated. It is sufficient to apply, for example, 0V to the second diffusion region 107b and the P-type well region 102, +1.8 V to the first diffusion region 107a, and +2 V to the gate electrode 104. By interchanging the source and drain regions of the case of reading information stored in the first memory functional unit 131a, information stored in the second memory functional unit 131b can be read.

In the case where a channel region (offset region 120) which is not covered with the gate electrode 104 remains, in the channel region which is not covered with the gate electrode 104, an inversion layer is dissipated or formed according to the presence/absence of excessive charges in the memory functional units 131a and 131b and, as a result, large hysteresis (change in the threshold) is obtained. However, when the offset region 120 is too wide, the drain current largely decreases and reading speed becomes much slower. Therefore, it is preferable to determine the width of the offset region 120 so as to obtain sufficient hysteresis and reading speed.

Also in the case where the diffusion regions 107a and 107b reach ends of the gate electrode 104, that is, the diffusion regions 107a and 107b overlap with the gate electrode 104, the threshold of the transistor hardly changes by the writing operation. However, parasitic resistance at the source/drain ends largely changes, and the drain current largely decreases (by equal to or more than one digit). Therefore, reading can be performed by detecting the drain current, and the function as a memory can be obtained. In the case where a larger memory hysteresis effect is necessary, it is preferable that the diffusion regions 107a and 107b and the gate electrode 104 are not overlapped (offset region 120 exists).

By the above operating method, two bits can be written/erased selectively per one transistor. By connecting a word line WL to the gate electrode 104 of the memory cell, connecting a first bit line BL1 to the first diffusion region 107a, connecting a second bit line BL2 to the second diffusion region 107b, and arranging memory cells, a memory cell array can be constructed.

In the above-described operating method, by interchanging the source electrode and the drain electrode, writing and erasing of two bits per one transistor are performed. Alternately, by fixing the source electrode and the drain electrode, the transistor may operate as a 1-bit memory. In this case, common fixed voltage can be applied to one of the source and drain regions, so that the number of bit lines connected to the source/drain regions can be reduced to the half.

As should be apparent from the above description, in the memory cell in the semiconductor memory device of the present invention, the memory functional unit is formed independently of the gate insulating film, and is formed on both sides of the gate electrode, so that 2-bit operation is possible. Since each memory functional unit is isolated by the gate electrode, interference at the time of rewriting is effectively suppressed. Further, since the gate insulating film is isolated from the memory functional unit, it can be formed thinly and a short channel effect can be suppressed. Therefore, reduction in size of the memory cell and, accordingly, the semiconductor memory device can be achieved easily.

Second Embodiment

Figure 8:
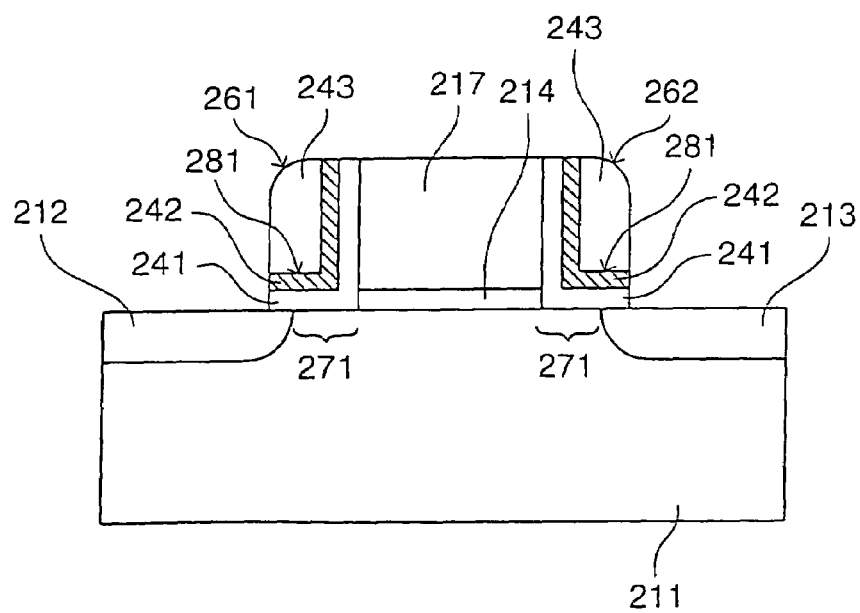
FIG. 8 is a schematic sectional view showing a main part of a memory cell (second embodiment) in a semiconductor memory device according to an embodiment of the present invention.

A memory cell in a semiconductor memory device according to a second embodiment has a configuration substantially similar to that of the memory cell 1 of FIG. 1 except that, as shown in FIG. 8, each of memory functional units 261 and 262 is constructed by a charge retaining region (which is a charge accumulating region and may be a film having the function of retaining charges) and a region for suppressing escape of charges (or a film having the function of suppressing escape of charges).

From the viewpoint of improving a memory retention characteristic, preferably, the memory functional unit includes a charge retaining film having the function of retaining charges and an insulating film. In the second embodiment, a silicon nitride film 242 having a level of trapping charges is used as the charge retaining film, and silicon oxide films 241 and 243 having the function of preventing dissipation of charges accumulated in the charge retaining are used as insulating films. The memory functional unit includes the charge retaining film and the insulating films, thereby preventing dissipation of charges, and the retention characteristic can be improved. As compared with the case where the memory functional unit is constructed only by the charge retaining film, the volume of the charge retaining film can be appropriately reduced, movement of charges in the charge retaining film is regulated, and occurrence of a characteristic change due to charge movement during retention of information can be suppressed. Further, by employing the structure in which the silicon nitride film 242 is sandwiched by the silicon oxide films 241 and 243, charge injecting efficiency at the time of rewriting operation becomes high, so that higher-speed operation can be performed. In the memory cell, the silicon nitride film 242 may be replaced with a ferroelectric.

The regions for retaining charges (silicon nitride films 242) in the memory functional units 261 and 262 overlap with diffusion regions 212 and 213. The overlap denotes herein that at least a part of the region for retaining charges (silicon nitride film 242) exists over at least a part of the diffusion regions 212 and 213. A reference numeral 211 denotes a semiconductor substrate, a reference numeral 214 denotes a gate insulating film, a reference numeral 217 denotes a gate electrode, and a reference numeral 271 indicates an offset region between the gate electrode 217 and the diffusion regions 212 and 213. Although not shown, the surface of the semiconductor substrate 211 under the gate insulating film 214 serves as a channel region.

An effect obtained when the silicon nitride films 242 as regions for retaining charges in the memory functional units 261 and 262 overlap with the diffusion regions 212 and 213 will be described.

Figure 9:
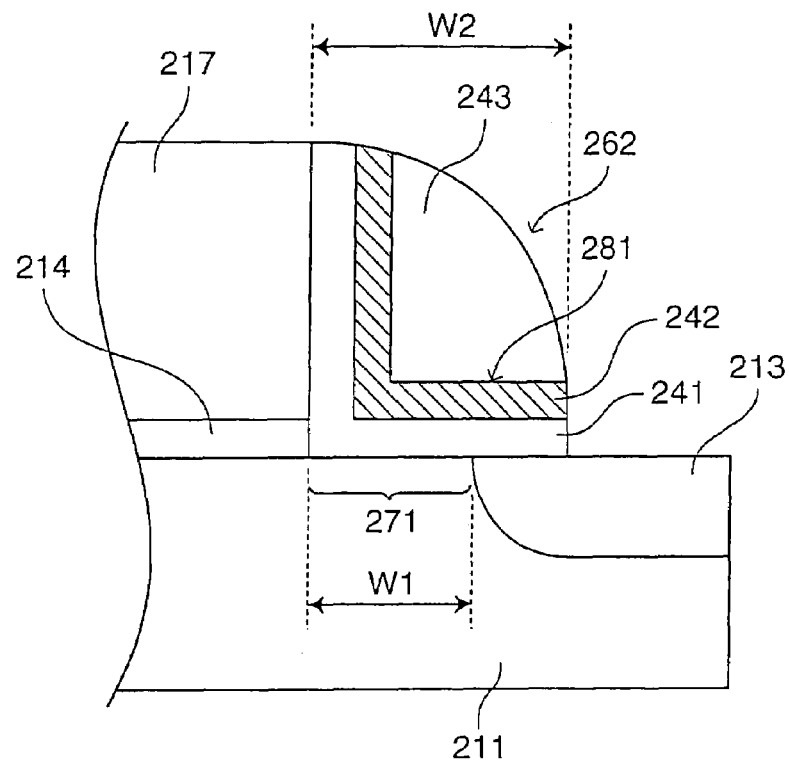
FIG. 9 is an enlarged schematic sectional view of the main part shown in FIG. 8.

As shown in FIG. 9, in an area around the memory functional unit 262, when an offset amount between the gate electrode 217 and the diffusion region 213 is W1 and the width of the memory functional unit 262 in a cross section in the channel length direction of the gate electrode is W2, the overlap amount between the memory functional unit 262 and the diffusion region 213 is expressed as W2−W1. It is important herein that the memory functional unit 262 constructed by the silicon oxide film 242 in the memory functional unit 262 overlaps with the diffusion region 213, that is, the relation of W2>W1 is satisfied.

In FIG. 9, an end on the side apart from the gate electrode 217 of the silicon nitride film 242 in the memory functional unit 262 matches with the end of the memory functional unit 262 on the side apart from the gate electrode 217, so that the width of the memory functional unit 262 is defined as W2.

Figure 10:
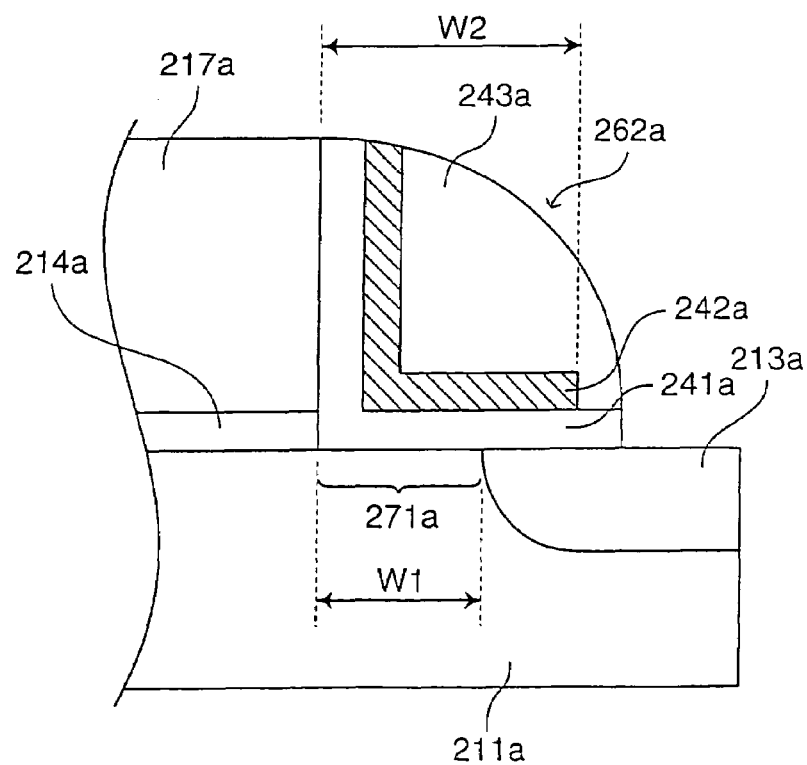
FIG. 10 is an enlarged schematic sectional view of a modification of the main part shown in FIG. 8.

As shown in FIG. 10, when the end on the side apart from the gate electrode of a silicon nitride film 242a in a memory functional unit 262a does not match with the end of the memory functional unit 262a on the side apart from the gate electrode, W2 may be defined as a distance from the gate electrode end to an end on the side apart from the gate electrode of the silicon nitride film 242a.

Figure 11:
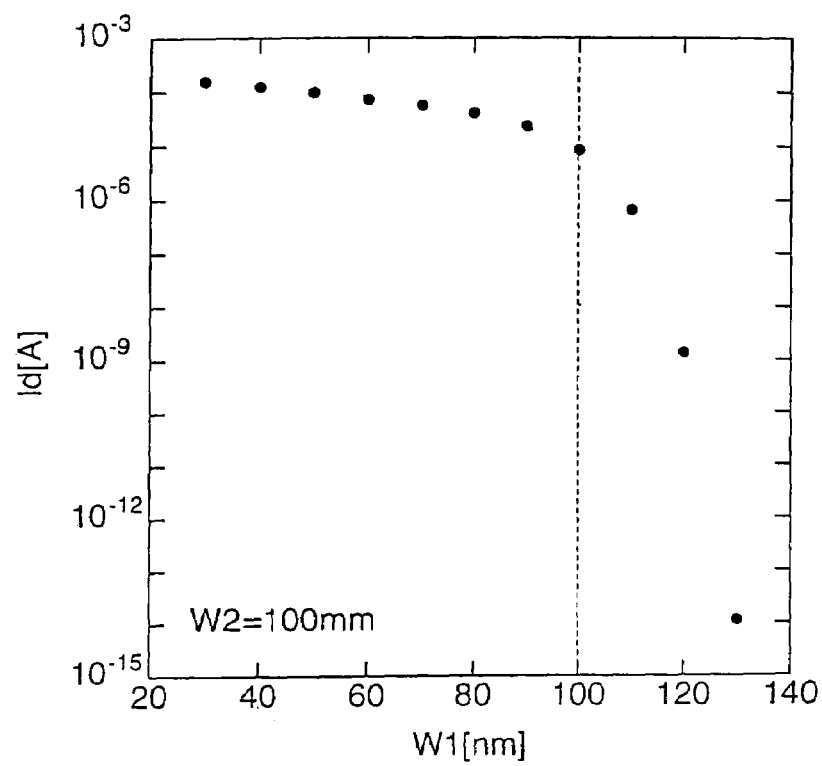
FIG. 11 is a graph showing electric characteristics of the memory cell (second embodiment) in a semiconductor memory device according to an embodiment of the present invention.

FIG. 11 shows drain current Id when the width W2 of the memory functional unit 262 is fixed to 100 nm and the offset amount W1 is changed in the structure of the memory cell of FIG. 9. Herein, the drain current was obtained by device simulation on assumption that the memory functional unit 262 is in erasing state (holes are accumulated), and the diffusion regions 212 and 213 serve as the source electrode and the drain electrode, respectively.

As obvious from FIG. 11, in the range where W1 is 100 nm or more (that is, the silicon nitride film 242 and the diffusion region 213 do not overlap with each other), the drain current sharply decreases. Since the drain current value is almost proportional to the reading operation speed, the performance of the memory sharply deteriorates with W1 of 100 nm or more. On the other hand, in the range where the silicon nitride film 242 and the diffusion region 213 overlap with each other, decrease in the drain current is gentle. Therefore, in the case of considering also variations in mass production, if at least a part of the silicon nitride film 242 as the film having the function of retaining charges does not overlap with the source and drain regions, it is difficult to obtain the memory function in reality.

On the basis of the result of the device simulation, by fixing W2 to 100 nm and setting W1 to 60 nm and 100 nm as design values, memory cell arrays were produced. In the case where W1 is 60 nm, the silicon nitride film 242 and the diffusion regions 212 and 213 overlap with each other by 40 nm as a design value. In the case-where W1 is 100 nm, there is no overlap as a design value. Reading time of the memory cell arrays was measured and worst cases considering variations were compared with each other. In the where W1 is set to 60 nm as a design value, read access time is 100 times as fast as that of the other case. In practice, the read access time is preferably 100 n/sec or less per one bit. When W1=W2, the condition cannot be achieved. In the case of considering manufacture variations as well, it is more preferable that (W2−W1)>10 nm.

To read information stored in the memory functional unit 261 (region 281), in a manner similar to the first embodiment, it is preferable to set the diffusion region 212 as a source electrode, set the diffusion region 213 as a drain region, and form a pinch-off point on the side closer to the drain region in the channel region. Specifically, at the time of reading information stored in one of the two memory functional units, it is preferable to form the pinch-off point in a region closer to the other memory functional unit, in the channel region. With the arrangement, irrespective of a storage state of the memory functional unit 262, information stored in the memory functional unit 261 can be detected with high sensitivity, and it is a large factor to achieve 2-bit operation.

On the other hand, in the case of storing information only one of two memory functional units or in the case of using the two memory functional units in the same storage state, it is not always necessary to form the pinch-off point at the time of reading.

Although not shown in FIG. 8, it is preferable to form a well region (P-type well in the case of-the N channel device) in the surface of the semiconductor substrate 211. By forming the well region, it becomes easy to control the other electric characteristics (withstand voltage, junction capacitance and short-channel effect) while setting the impurity concentration in the channel region optimum to the memory operations (rewriting operation and reading operation).

Figure 12:
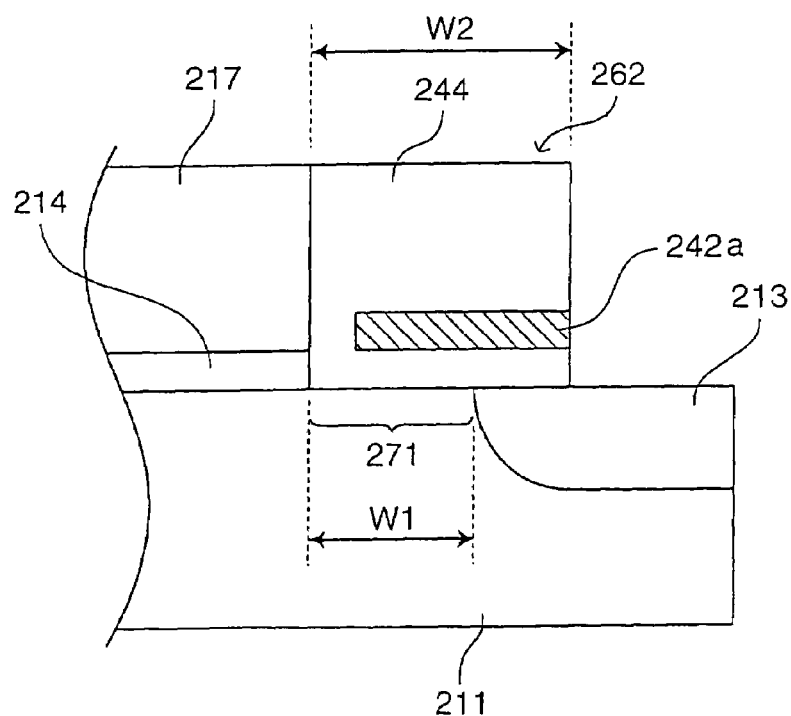
FIG. 12 is a schematic sectional view showing a main part of a modification of the memory cell (second embodiment) in a semiconductor memory device according to an embodiment of the present invention.

The memory functional unit preferably includes the charge retaining film disposed almost in parallel with the gate insulating film surface. In other words, it is preferable that the level of the top face of the charge retaining film in the memory functional unit is positioned parallel to the level of the top face of the gate insulating film 214. Concretely, as shown in FIG. 12, the silicon nitride film 242a as a charge retaining film of the memory functional unit 262 has a surface substantially parallel with the surface of the gate insulating film 214. In other words, it is preferable that the silicon nitride film 242a is formed at a level parallel to the level corresponding to the surface of the gate insulating film 214.

By the existence of the silicon nitride film 242a substantially parallel to the surface of the gate insulating film 214 in the memory functional unit 262, formation easiness of the inversion layer in the offset region 271 can be effectively controlled in accordance with an amount of charges accumulated in the silicon nitride film 242a. Thus, the memory effect can be increased. By forming the silicon nitride film 242a substantially parallel to the surface of the gate insulating film 214, even in the case where the offset amount (W1) varies, a change in the memory effect can be maintained relatively small, and variations of the memory effect can be suppressed. Moreover, movement of the charges upward in the silicon nitride film 242a is suppressed, and occurrence of a characteristic change due to the charge movement during retention of information can be suppressed.

Preferably, the memory functional unit 262 includes an insulating film (for example, portion on the offset region 271 in the silicon oxide film 244) for separating the silicon nitride film 242a which is substantially parallel to the surface of the gate insulating film 214 and the channel region (or well region). By the insulating film, dissipation of-the charges accumulated in the charge retaining film is suppressed and a memory cell having a better retention characteristic can be obtained.

By controlling the thickness of the silicon nitride film 242a and controlling the thickness of the insulating film below the silicon nitride film 242a (portion on the offset region 271 in the silicon oxide film 244) to be constant, the distance from the surface of the semiconductor substrate to charges accumulated in the charge retaining film can be maintained substantially constant. To be specific, the distance from the surface of the semiconductor substrate to the charges accumulated in the charge retaining film can be controlled in a range from the minimum thickness value of the insulating film under the silicon nitride film 242*a* to the sum of the maximum thickness value of the insulating film under the silicon nitride film 242*a* and the maximum thickness value of the silicon nitride film 242*a*. Consequently, density of electric lines of force generated by the charges accumulated in the silicon nitride film 242*a* can be substantially controlled, and variations in the memory effect of the memory cell can be reduced very much.

Third Embodiment

Figure 13:
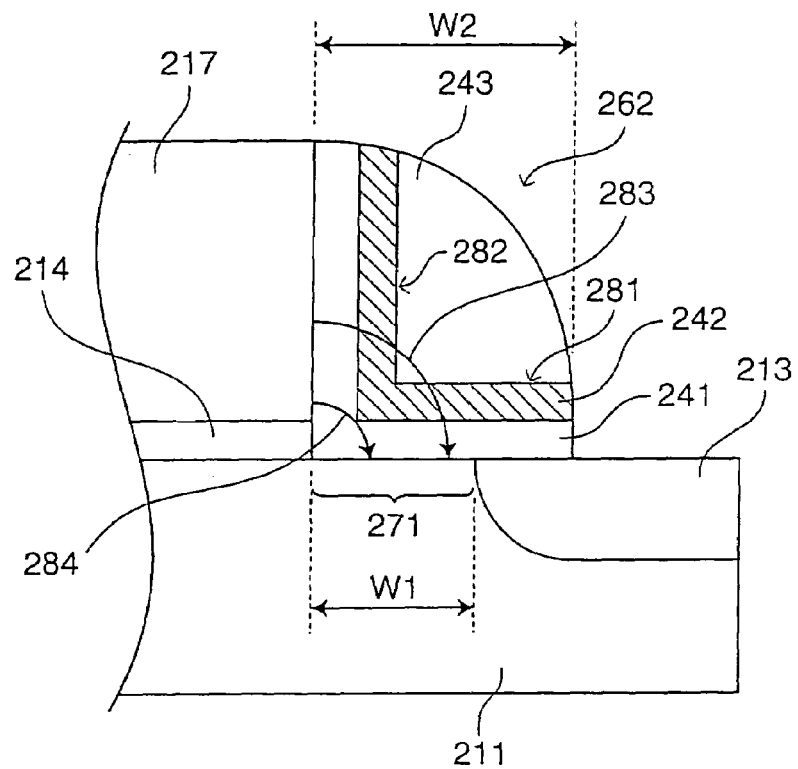
FIG. 13 is a schematic sectional view showing a main part of a memory cell (third embodiment) in a semiconductor memory device according to an embodiment of the present invention.

The memory functional unit 262 in a semiconductor memory device of a third embodiment has a shape in which the silicon nitride film 242 as a charge retaining film has substantially uniform thickness and is disposed substantially in parallel with the surface of the gate insulating film 214 as shown in FIG. 13 (region 281) and, further, substantially in parallel with a side face of the gate electrode 217 (region 282).

In the case where positive voltage is applied to the gate electrode 217, an electric line 283 of force in the memory functional unit 262 passes the silicon nitride film 242 twice (regions 282 and 281) as shown by an arrow. When negative voltage is applied to the gate electrode 217, the direction of the electric line of force becomes opposite. Herein, the dielectric constant of the silicon nitride film 242 is about 6, and that of silicon oxide films 241 and 243 is about 4. Therefore, effective dielectric constant of the memory functional unit 262 in the direction of the electric line 283 of force is higher and the potential difference at both ends of the electric line of force can be reduced more as compared with the case where only the region 281 of the charge retaining film exists. In other words, a large part of the voltage applied to the gate electrode 217 is used to enhance the electric field in the offset region 271.

The reason why charges are injected to the silicon nitride film 242 in the rewriting operation is because generated charges are attracted by the electric field in the offset region 271. Therefore, by including the charge retaining film shown by the arrow 282, charges injected into the memory functional unit 262 increase in the rewriting operation, and the rewriting speed increases.

In the case where the portion of the silicon oxide film 243 is also the silicon nitride film, that is, in the case where the level of the charge retaining film is not parallel with the level corresponding to the surface of the gate insulating film 214, upward movement of charges in the silicon nitride film becomes conspicuous, and the retention characteristic deteriorates.

More preferably, in place of the silicon nitride film, the charge retaining film is made of a high dielectric such as hafnium oxide having a very high dielectric constant.

It is preferable that the memory functional unit further includes an insulating film (portion on the offset region 271 in the silicon oxide film 241) for separating the charge retaining film substantially parallel to the surface of the gate insulating film and the channel region (or well region). By the insulating film, dissipation of charges accumulated in the charge retaining film is suppressed, and the retention characteristic can be further improved.

Preferably, the memory functional unit further includes an insulating film (portion in contact with the gate electrode 217 in the silicon oxide film 241) for separating the gate electrode and the charge retaining film extended substantially parallel with the side face of the gate electrode. The insulating film prevents injection of charges from the gate electrode into the charge retaining film and accordingly prevents a change in the electric characteristics. Thus, the reliability of the memory cell can be improved.

Further, in a manner similar to the second embodiment, it is preferable to control the thickness of the insulating film under the silicon nitride film 242 (portion on the offset region 271 in the silicon oxide film 241) to be constant and to control the thickness of the insulating film on the side face of the gate electrode (portion in contact with the gate electrode 217 in the silicon oxide film 241) to be constant. Consequently, the density of the electric lines of force generated by the charges accumulated in the silicon nitride film 242 can be substantially controlled, and charge leak can be prevented.

Fourth Embodiment

In a fourth embodiment, optimization of the gate electrode, the memory functional unit, and the distance between the source and drain regions of a memory cell in a semiconductor memory device will be described.

Figure 14:
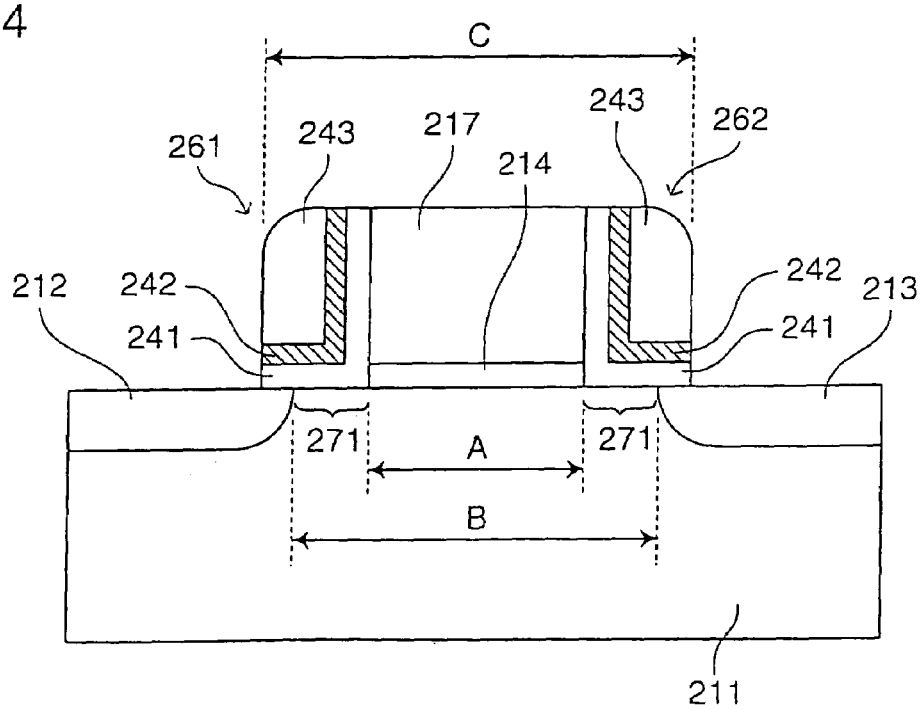
FIG. 14 is a schematic sectional view showing a main part of a memory cell (fourth embodiment) in a semiconductor memory device according to an embodiment of the present invention.

As shown in FIG. 14, a reference character A denotes length of the gate electrode-in a cut surface in the channel length direction, a reference character B denotes the distance between the source and drain regions (channel length), and a reference character C denotes the distance from the end of one of memory functional units to the end of the other memory functional unit, that is, the distance between the end (on the side far from the gate electrode) of a film having the function of retaining charges in one of memory functional units to the end (on the side apart from the gate electrode) of a film having the function of retaining charges in the other memory functional unit in a cut surface in the channel length direction.

In such a memory cell, B<C is preferable. By satisfying such a relation, the offset regions 271 exist between the portion under the gate electrode 217 in the channel region and the diffusion regions 212 and 213. Consequently, easiness of inversion effectively fluctuates in the whole offset regions 271 by charges accumulated in the memory functional units 261 and 262 (silicon nitride films 242). Therefore, the memory effect increases and, particularly, higher-speed reading operation is realized.

In the case where the gate electrode 217 and the diffusion regions 212 and 213 are offset from each other, that is, in the case where the relation of A<B is satisfied, easiness of inversion in the offset region when voltage is applied to the gate electrode largely varies according to an amount of charges accumulated in the memory functional unit, so that the memory effect increases, and the short channel effect can be reduced.

However, as long as the memory effect appears, the offset region 271 does not always have to exist. Also in the case where the offset region 271 does not exist, if the impurity concentration in the diffusion regions 212 and 213 is sufficiently low, the memory effect can be exhibited in the memory functional units 261 and 262 (silicon nitride films 242).

Therefore, A<B<C is the most preferable.

Fifth Embodiment

Figure 15:
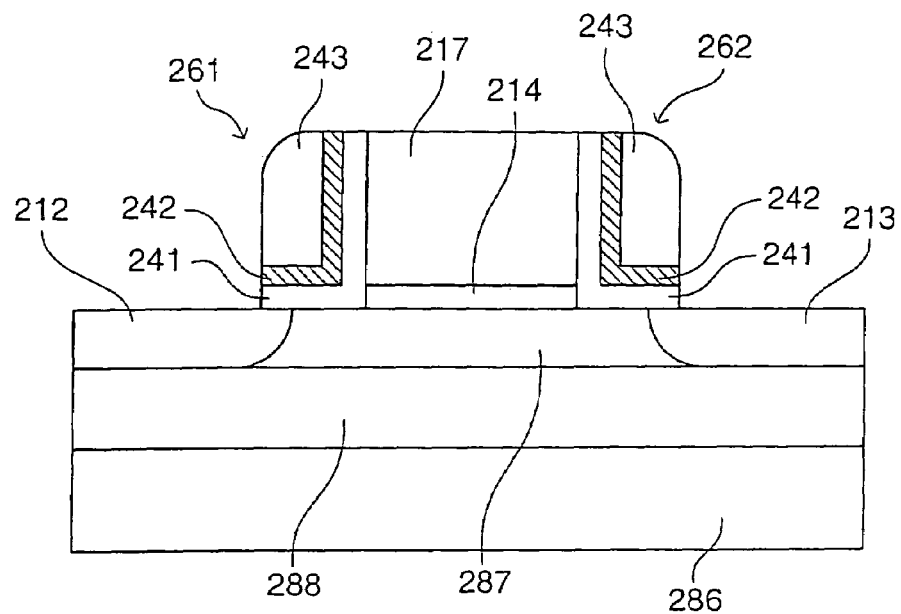
FIG. 15 is a schematic sectional view showing a main part of a memory cell (fifth embodiment) in a semiconductor memory device according to an embodiment of the present invention.

A memory cell of a semiconductor memory device in a fifth embodiment has a substantially similar configuration to that of the second embodiment except that an SOI substrate is used as the semiconductor substrate in the second embodiment as shown in FIG. 15.

In the memory cell, a buried oxide film 288 is formed on a semiconductor substrate 286, and an SOI layer is formed on the buried oxide film 288. In the SOI layer, the diffusion regions 212 and 213 are formed and the other region is a body region 287.

By the memory cell as well, action and effect similar to those of the memory cell of the second embodiment are obtained. Further, junction capacitance between the diffusion regions 212 and 213 and the body region 287 can be remarkably reduced, so that higher-speed operation and lower power consumption of the device can be achieved.

Sixth Embodiment

Figure 16:
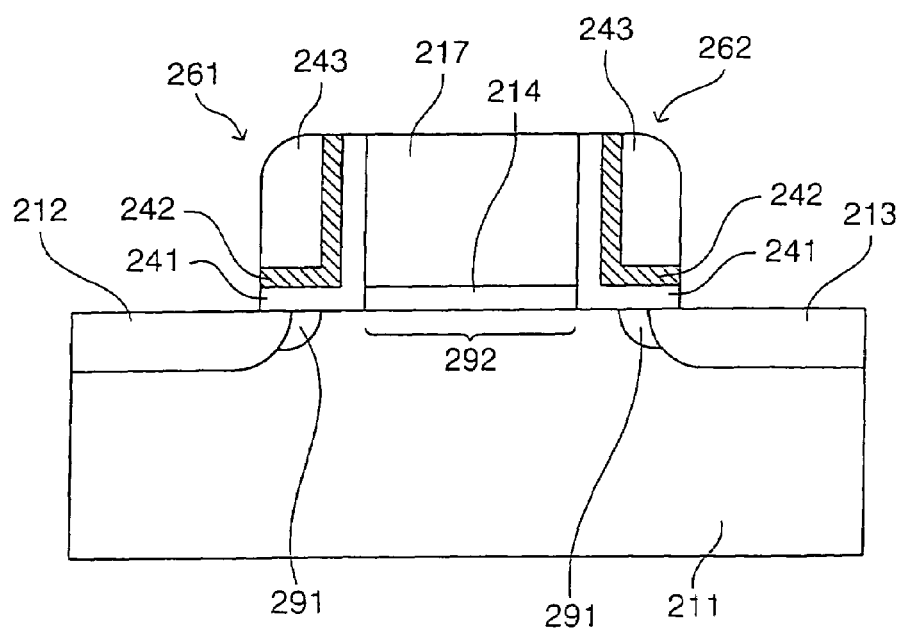
FIG. 16 is a schematic sectional view showing a main part of a memory cell (sixth embodiment) in a semiconductor memory device according to an embodiment of the present invention.

A memory cell in a semiconductor memory device in a sixth embodiment has, as shown in FIG. 16, a configuration substantially similar to that of the memory cell of the second embodiment except that a P-type high-concentration region 291 is added adjacent to the channel sides of the N-type diffusion regions 212 and 213.

Specifically, the concentration of a P-type impurity (for example, boron) in the P-type high-concentration region 291 is higher than that of a P-type impurity in a region 292. Suitable P-type impurity concentration in the P-type high-concentration region 291 is, for example, about $5 \times 10^{17}$ to $1 \times 10^{19}$ cm$^{-3}$. The P-type impurity concentration of the region 292 can be set to, for example, $5 \times 10^{16}$ to $1 \times 10^{18}$ cm$^{-3}$.

By providing the P-type high-concentration region 291, the junction between the diffusion regions 212 and 213 and the semiconductor substrate 211 becomes sharp below the memory functional units 261 and 262. Consequently, hot carriers are easily generated in the writing and erasing operations, the voltage of the writing and erasing operations can be decreased or the writing operation and the erasing operation can be performed at high speed. Moreover, since the impurity concentration in the region 292 is relatively low, the threshold when the memory is in the erasing state is low, and the drain current is large. Consequently, the reading speed is improved. Therefore, the memory cell with low rewriting voltage or high rewriting speed and high reading speed can be obtained.

In FIG. 16, by providing the P-type high-concentration region 291 in the vicinity of the source/drain regions and below the memory functional unit (that is, not immediately below the gate electrode), the threshold of the whole transistor remarkably increases. The degree of increase is much higher than that in the case where the P-type high-concentration region 291 is positioned immediately below the gate electrode. In the case where write charges (electrons when the transistor is of the N-channel type) are accumulated in the memory functional unit, the difference becomes larger. On the other hand, in the case where sufficient erasing charges (positive holes when the transistor is of the N-channel type) are accumulated in the memory functional unit, the threshold of the whole transistor decreases to a threshold determined by the impurity concentration in the channel region (region 292) below the gate electrode. That is, the threshold in the erasing operation does not depend on the impurity concentration of the P-type high-concentration region 291 whereas the threshold in the writing operation is largely influenced. Therefore, by disposing the P-type high-concentration region 291 under the memory functional unit and in the vicinity of the source/drain regions, only the threshold in the writing operation largely fluctuates, and the memory effect (the difference between the threshold in the writing operation and that in the erasing operation) can be remarkably increased.

Seventh Embodiment

Figure 17:
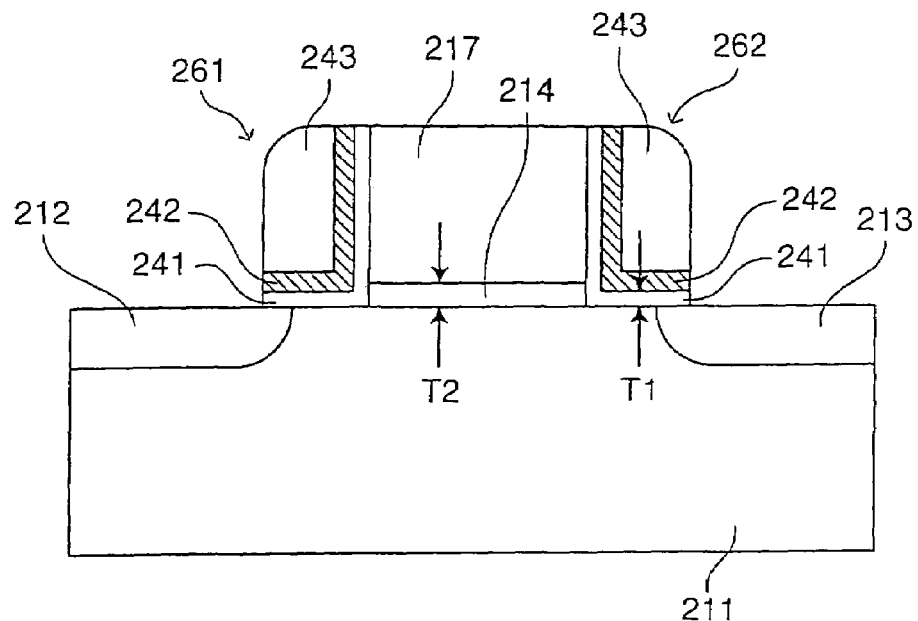
FIG. 17 is a schematic sectional view showing a main part of a memory cell (seventh embodiment) in a semiconductor memory device according to an embodiment of the present invention.

A memory cell in a semiconductor memory device of a seventh embodiment has a configuration substantially similar to that of the second embodiment except that, as shown in FIG. 17, the thickness (T1) of an insulating film separating the charge retaining film (silicon nitride film 242) and the channel region or well region is smaller than the thickness (T2) of the gate insulating film.

The thickness T2 of the gate insulating film 214 has the lower limit value from the demand of withstand voltage at the time of rewriting operation of the memory. However, the thickness T1 of the insulating film can be made smaller, than T2 irrespective of the demand of withstand voltage.

The flexibility of designing with respect to T1 is high in the memory cell for the following reason.

In the memory cell, the insulating film for separating the charge retaining film and the channel region or well region is not sandwiched by the gate electrode and the channel region or well region. Consequently, to the insulating film for separating the charge retaining film and the channel region or well region, a high electric field acting between the gate electrode and the channel region or well region does not directly act, but a relatively low electric field spreading from the gate electrode in the lateral direction acts. Consequently, irrespective of the demand of withstand voltage to the gate insulating film, T1 can be made smaller than T2.

By making T1 thinner, injection of charges into the memory functional unit becomes easier, the voltage of the writing operation and the erasing operation is decreased or the writing operation and erasing operation can be performed at high speed. Since the amount of charges induced in the channel region or well region when charges are accumulated in the silicon nitride film 242 increases, the memory effect can be increased.

The electric lines of force in the memory functional unit include a short one which does not pass through the silicon nitride film 242 as shown by an arrow 284 in FIG. 13. On the relatively short electric line of force, electric field intensity is relatively high, so that the electric field along the electric line of power plays a big role in the rewriting operation. By reducing T1, the silicon nitride film 242 is positioned downward in the figure, and the electric line of force indicated by the arrow 283 passes through the silicon nitride film. Consequently, the effective dielectric constant in the memory functional unit along the electric line 284 of force increases, and the potential difference at both ends of the electric line of force can be further decreased. Therefore, a large part of the voltage applied to the gate electrode 217 is used to increase the electric field in the offset region, and the writing operation and the erasing operation become faster.

In contrast, for example, in an EEPROM typified by a flash memory, the insulating film separating the floating gate and the channel region or well region is sandwiched by the gate electrode (control gate) and the channel region or well region, so that a high electric field from the gate electrode directly acts. Therefore, in an EEPROM, the thickness of the insulating film separating the floating gate and the channel region or well region is regulated, and optimization of the function of the memory cell is inhibited.

As should be apparent from the above, by setting T1<T2, without deteriorating the withstand voltage performance of the memory, the voltage of the writing and erasing operations is decreased, or the writing operation and erasing operation are performed at high speed and, further, the memory effect can be increased. More preferably, the thickness Ti of the insulating film is 0.8 nm or more at which uniformity or quality by a manufacturing process can be maintained at a predetermined level and which is the limitation that the retention characteristic does not deteriorate extremely.

Concretely, in the case of a liquid crystal driver LSI requiring high withstand voltage in a design rule, to drive the liquid crystal panel TFT, voltage of 15 to 18 V at the maximum is required, so that the gate oxide film cannot be thinned normally. In the case of mounting a nonvolatile memory for image adjustment on the liquid crystal driver LSI, in the memory cell of an embodiment of the present invention, the thickness of the insulating film separating the charge retaining film (silicon nitride film 242) and the channel region or well region can be designed optimally independently of the thickness of the gate insulating film. For example, the thickness can be individually set as T1 20 nm and T2=10 nm for a memory cell having a gate electrode length (word line width) of 250 nm, so that a memory cell having high writing efficiency can be realized (the reason why the short channel effect is not produced when T1 is larger than the thickness of a normal logic transistor is because the source and drain regions are offset from the gate electrode).

Eighth Embodiment

Figure 18:
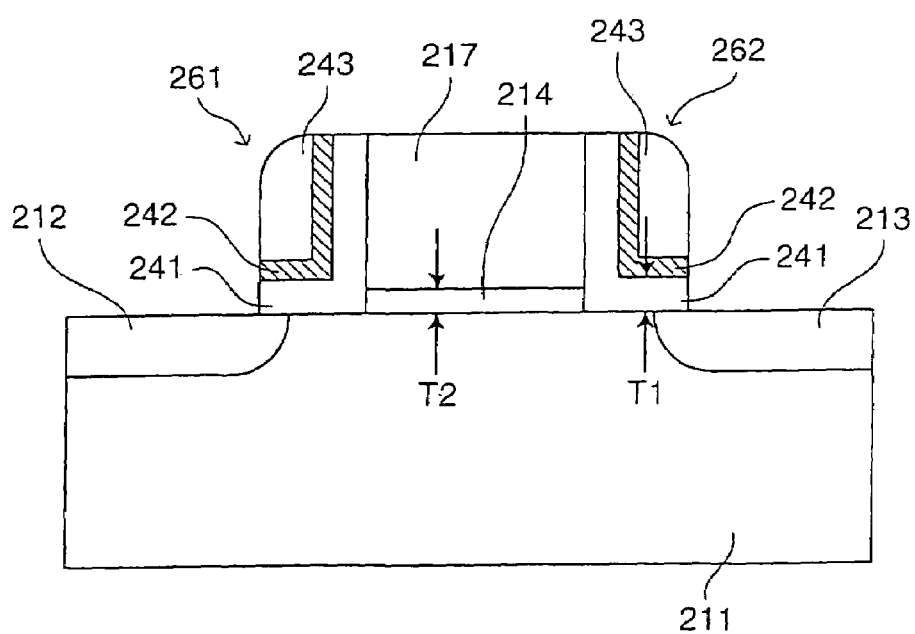
FIG. 18 is a schematic sectional view showing a main part of a memory cell (eighth embodiment) in a semiconductor memory device according to an embodiment of the present invention.

A memory cell in a semiconductor memory device of an eighth embodiment has a configuration substantially similar to that of the second embodiment except that, as shown in FIG. 18, the thickness (T1) of the insulating film separating the charge retaining film (silicon nitride film 242) and the channel region or well region is larger than the thickness (T2) of the gate insulating film.

The thickness T2 of the gate insulating film 214 has an upper limit value due to demand of preventing a short channel effect of the device. However, the thickness T1 of the insulating film can be made larger than T2 irrespective of the demand of preventing the short channel effect. Specifically, when reduction in scaling progresses (when reduction in thickness of the gate insulating film progresses), the thickness of the insulating film separating the charge retaining film (silicon nitride film 242) and the channel region or well region can be designed optimally independent of the gate insulating film thickness. Thus, an effect that the memory functional unit does not disturb scaling is obtained.

The reason why flexibility of designing T1 is high in the memory cell is that, as described already, the insulating film separating the charge retaining film and the channel region or well region is not sandwiched by the gate electrode and the channel region or well region. Consequently, irrespective of the demand of preventing the short channel effect for the gate insulating film, T1 can be made thicker than T2.

By making T1 thicker, dissipation of charges accumulated in the memory functional unit can be prevented and the retention characteristic of the memory can be improved.

Therefore, by setting T1>T2, the retention characteristic can be improved without deteriorating the short channel effect of the memory.

The thickness T1 of the insulating film is, preferably, 20 nm or less in consideration of decrease in rewriting speed.

Concretely, in a conventional nonvolatile memory typified by a flash memory, a selection gate electrode serves as a write erase gate electrode, and a gate insulating film (including a floating gate) corresponding to the write erase gate electrode also serves as a charge accumulating film. Since a demand for size reduction (thinning of a film is indispensable to suppress short channel effect) and a demand for assuring reliability (to suppress leak of retained charges, the thickness of the insulating film separating the floating gate and the channel region or well region cannot be reduced to about 7 nm or less) are contradictory, it is difficult to reduce the size. Actually, according to the ITRS (International Technology Roadmap for Semiconductors), there is no prospect of reduction in a physical gate length of about 0.2 micron or less. In the memory cell, since T1 and T2 can be individually designed as described above, size reduction is made possible.

For example, for a memory cell having a gate electrode length (word line width) of 45 nm, T2=4 nm and T1=7 nm are individually set, and a memory cell in which the short channel effect is not produced can be realized. The reason why the short channel effect is not produced even when T2 is set to be thicker than the thickness of a normal logic transistor is because the source/drain regions are offset from the gate electrode.

Since the source/drain regions are offset from the gate electrode in the memory cell, as compared with a normal logic transistor, reduction in size is further facilitated.

Since the electrode for assisting writing and erasing does not exist in the upper part of the memory functional unit, a high electric field acting between the electrode for assisting writing and erasing and the channel region or well region does not directly act on the insulating film separating the charge retaining film and the channel region or well region, but only a relatively low electric field which spreads in the horizontal direction from the gate electrode acts. Consequently, the memory cell having a gate length which is reduced to be equal to or less than the gate length of a logic transistor of the same process generation can be realized.

Ninth Embodiment

A ninth embodiment relates to a change in the electric characteristic at the time of rewriting a memory cell of a semiconductor memory device.

Figure 19:
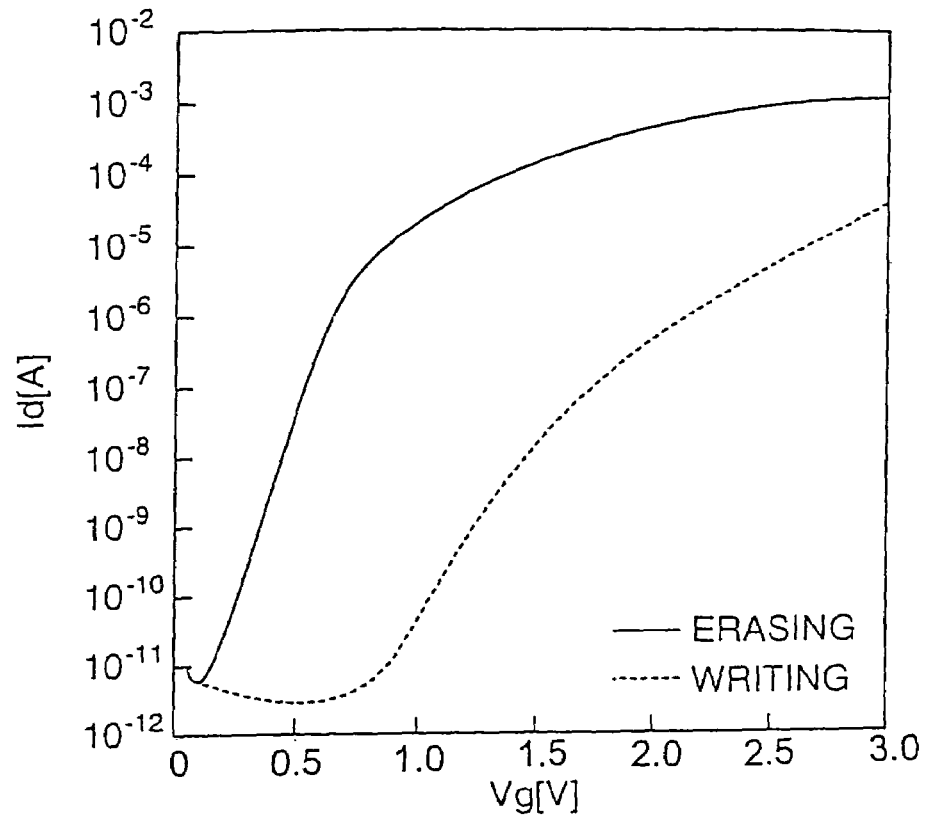
FIG. 19 is a graph showing electric characteristics of a memory cell (ninth embodiment) in a semiconductor memory device according to an embodiment of the present invention.

In an N-channel type memory cell, when an amount of charges in a memory functional unit changes, a drain current (Id)-gate voltage (Vg) characteristic (actual measurement value) as shown in FIG. 19 is exhibited.

Figure 27:
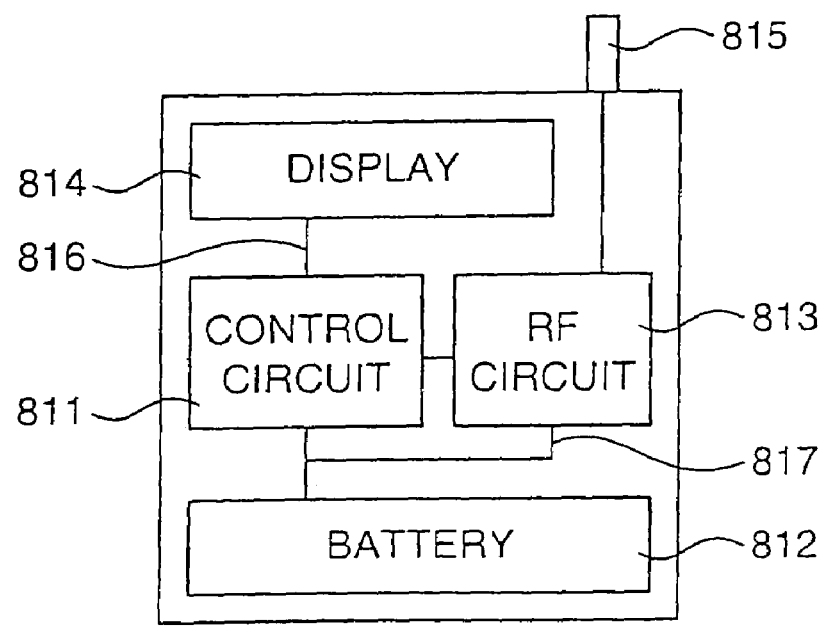
FIG. 27 is a schematic configuration diagram showing a portable electronic apparatus (twelfth embodiment) incorporating therein a semiconductor memory device according to an embodiment of the present invention.
Figure 28:
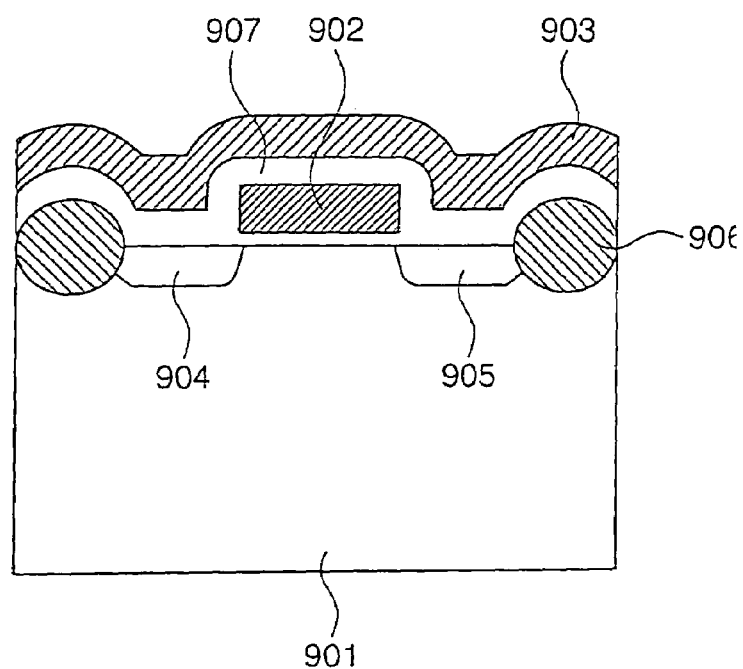
FIG. 28 is a schematic sectional view showing a main part of a conventional flash memory.
Figure 29:
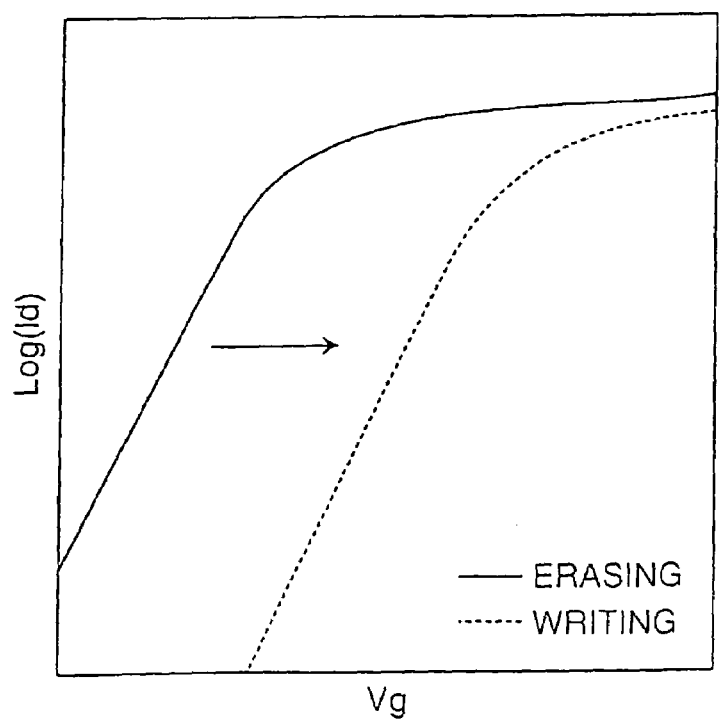
FIG. 29 is a graph showing electric characteristics of a conventional flash memory.

As obvious from FIG. 19, in the case of performing a writing operation in an erasing state (solid line), not only the threshold simply increases, but also the gradient of a graph remarkably decreases in a sub-threshold region. Consequently, also in a region where a gate voltage (Vg) is relatively high, the drain current ratio between the erasing state and the writing state is high. For example, also at Vg=2.5V, the current ratio of two digits or more is maintained. The characteristic is largely different from that in the case of a flash memory (FIG. 27).

Appearance of such a characteristic is a peculiar phenomenon which occurs since the gate electrode and the diffusion region are offset from each other, and the gate electric field does not easily reach the offset region. When the memory cell is in a writing state, even when a positive voltage is applied to the gate electrode, an inversion layer is extremely hard to be formed in the offset region under the memory functional unit. This is the cause that the gradient of the Id-Vg curve is gentle in the sub-threshold region in the writing state.

On the other hand, when the memory cell is in an erasing state, electrons of high density are induced in the offset region. Further, when 0 V is applied to the gate electrode (that is, when the gate electrode is in an off state), electrons are not induced in the channel below the gate electrode (consequently, an off-state current is small). This is the cause that the gradient of the Id-Vg curve is sharp in the sub-threshold region in the erasing state, and current increasing rate (conductance) is high in the region of the threshold or more.

As will be understood from the above, in the memory cell in the semiconductor memory device of an embodiment of the present invention, the drain current ratio between the writing operation and the erasing operation can be particularly made high.

Tenth Embodiment

A tenth embodiment relates to a semiconductor memory device, in which the plurality of memory cells described in the first to ninth embodiments are arrayed, and further, to a semiconductor memory device having a negative voltage switching circuit.

A negative voltage switching circuit is required for applying a negative voltage to a gate of a memory cell during an erasing processing period in a semiconductor memory device. As described below in detail, according to the present embodiment, the negative voltage switching circuit includes a P-channel switching transistor, for applying a negative voltage to a local word line when turned on. The negative voltage switching circuit includes a pull-up circuit formed of another P-channel transistor for selectively applying a positive voltage to a control terminal of the switching transistor, and a pull-down circuit formed of a resistor for applying a negative voltage to the control terminal of the switching transistor when the pull-up circuit does not apply any positive voltage to the control terminal of the switching transistor. When the pull-up circuit applies the positive voltage to the control terminal of the switching transistor, the switching transistor is turned off so as not to apply any negative voltage to the word line. In contrast, when the pull-up circuit does not apply any positive voltage to the control terminal of the switching transistor, the pull-down circuit applies the negative voltage to the control terminal of the switching transistor, so as to turn on the switching transistor, thereby applying the negative voltage to the word line. The negative voltage switching circuit according to the present embodiment will be further described below with reference to FIGS. 20 to 25.

Figure 20:
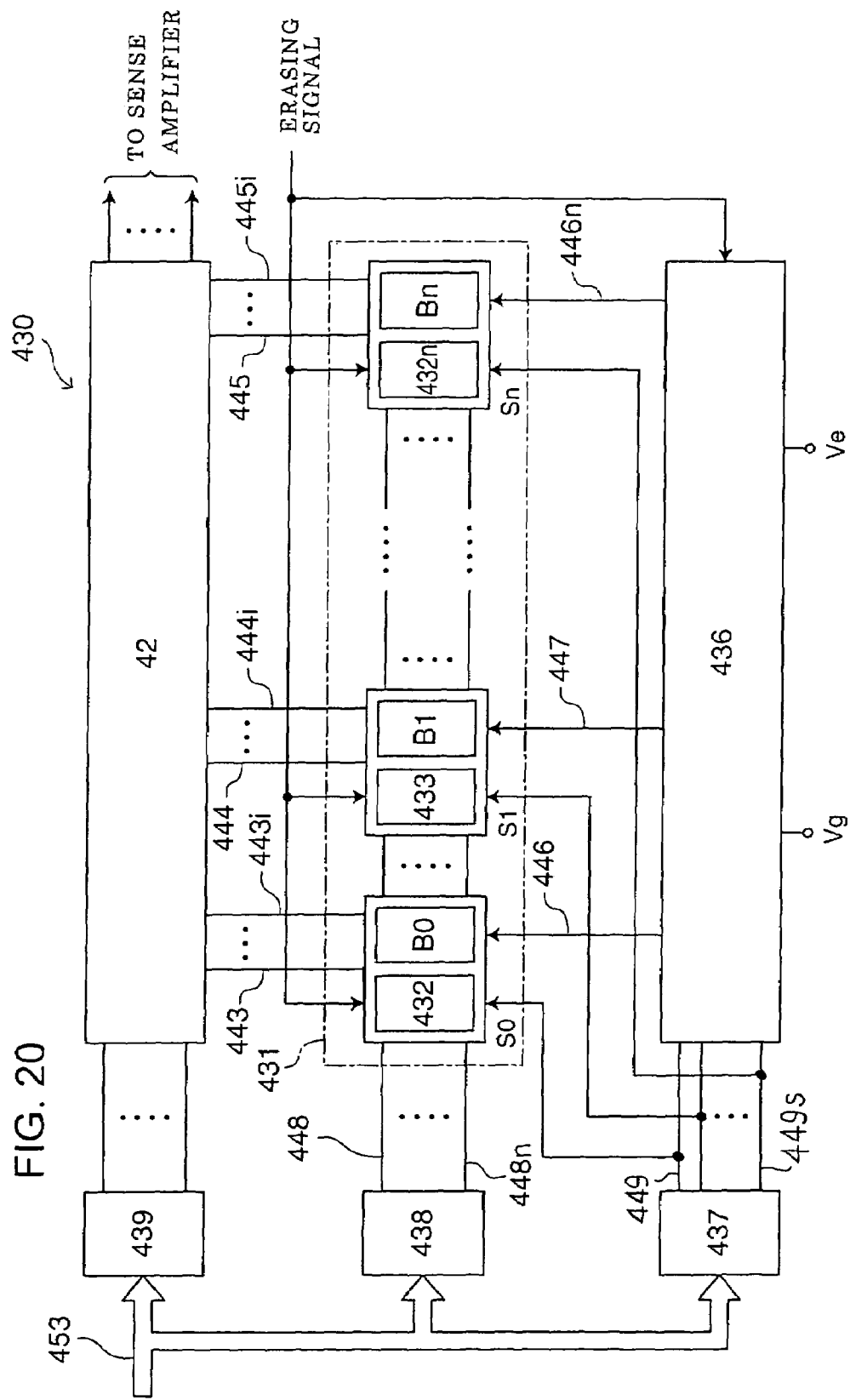
FIG. 20 is a block diagram showing a semiconductor memory device (tenth embodiment) according to an embodiment of the present invention.

FIG. 20 is a block diagram showing a semiconductor memory device 430 and, more particularly, showing a negative voltage switching circuit for enabling negative gate erasure in the semiconductor memory device 430. The semiconductor memory device 430 includes a memory array 431 which is constituted of a plurality of memory cells for storing data at addresses.

The memory array 431 is constituted by a plurality of blocks B0 to Bn each of which has a local row decoder. For example, the block B0 has a local row decoder 432. Each of the blocks includes a plurality of bit lines only extending in a specific block and a plurality of local word lines only extending in that block. Memory cells are disposed at intersection points of local word lines and bit lines. The bit lines of the memory array 431 are connected to a column decoder 439 via a column gate circuit 442.

Figure 21:
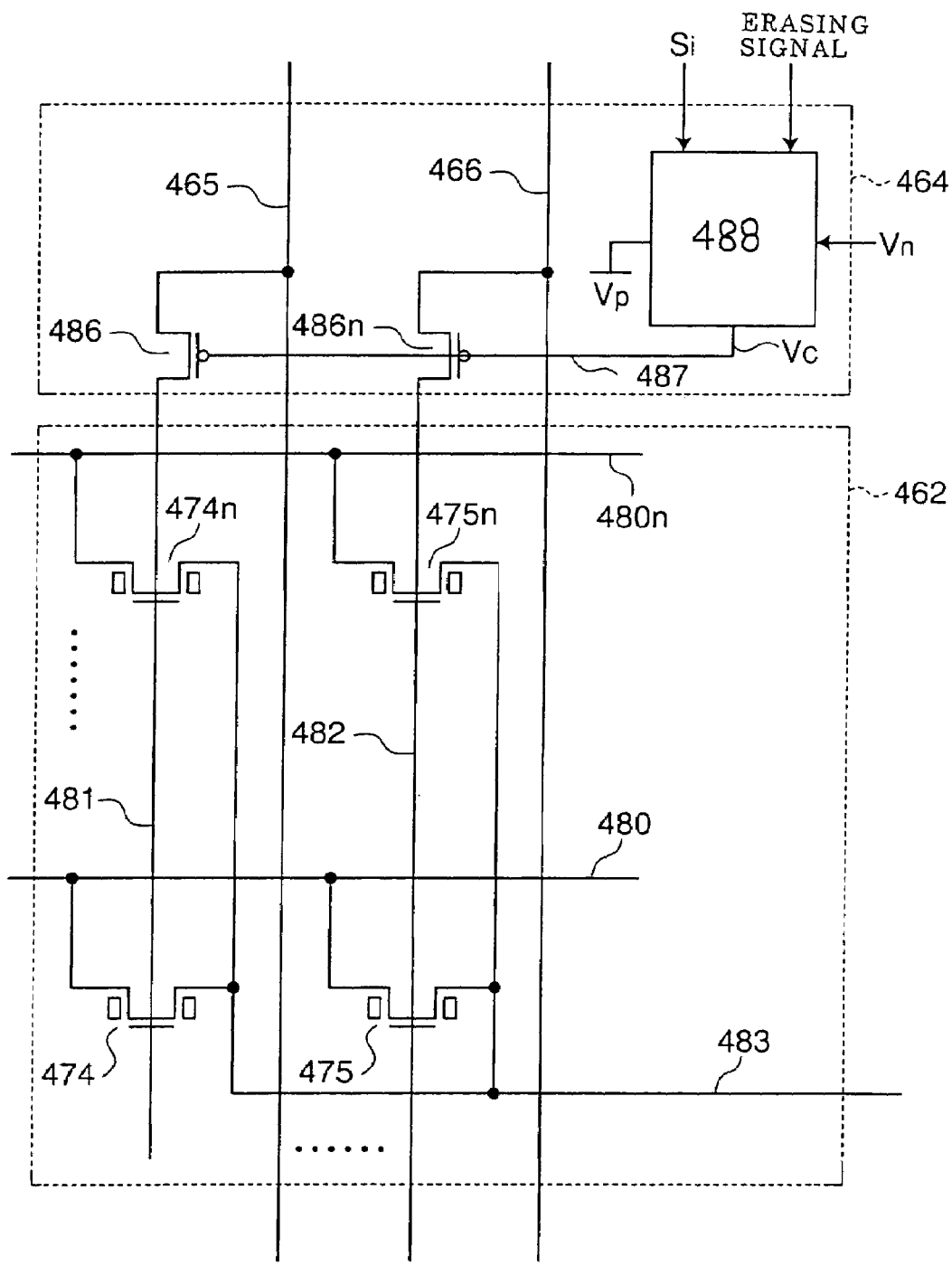
FIG. 21 is a circuit diagram showing a main part of the semiconductor memory device (tenth embodiment) according to an embodiment of the present invention.

The local word lines in each of the blocks B0 to Bn are connected to the local row decoder 432 in each of the blocks B0 to Bn. Furthermore, the memory array 431 includes a plurality of global word lines 448 to 448n connected to a global row decoder 438. The global word lines 448 to 448n are connected to each of the local row decoders 432 to 432n and extend through all of the blocks B0 to Bn. Although the global word lines 448 to 448n are not physically connected to the local word lines in the blocks of the memory array 431, the global word lines 448 to 448n can be electrically connected to the local word lines of each block via the local row decoders 432 to 432n in the blocks. FIG. 21 shows each of modes of the blocks B0 to Bn which will be described later.

The global row decoder 438 is a row decoder in the memory array 431, which selects one of the global word lines 448 to 448n upon reception of a row address from an address bus 453. Each of the local row decoders 432 to 432n includes a plurality of switching transistors (not shown) and is adapted to connect the local word line to a corresponding global word line. Each of the local row decoders 432 to 432n receives a block selecting signal from a block decoder 437. For example, the local row decoder 432 receives a block selecting signal S0. When the local row decoder receives the block selecting signal, all of the switching transistors in each of the local row decoders are turned on. Unless the local row decoder receives the block selecting signal, the transistors in each of the local column decoders are in a turning-off state. Consequently, the local word lines in a block are insulated from the global word lines and from the local word lines in the other blocks during a memory processing period. Each of the local column decoders 432 to 432n also receives an erasure controlling signal, that is, an erasing signal. The block decoder 437 selects a block by outputting an appropriate one of the block selecting signals S0 to Sn. Moreover, the block decoder 437 is connected to the bus 453 and, therefore, receives the block address.

An erasing switch 436 includes a plurality of switches (not shown in FIG. 20) each of which is connected to a common power source line in one of the blocks B0 to Bn. Each of the erasing switches 436 selectively connects a voltage Vg (i.e., ground) or a voltage Ve (i.e., an erasure voltage) to one of common power source lines 446 to 446n in a block concerned in response to the block selecting signal transmitted on one of selecting lines 449 to 449s by memory processing (i.e., reading, writing and erasing processings). In other words, the erasing switch 436 applies the voltage Vg to all of the common power source lines 446 to 446n during the reading and writing processing period in the semiconductor memory device 430 irrespective of the block selecting signals S0 to Sn. When the erasing processing is performed in response to an erasing signal in the semiconductor memory device 430, the block decoder 437 outputs the selected block signal, and then, the corresponding switch of the erasing switch 436 applies the voltage Ve to the selected block. In the meantime, other switches of the erasing switches 436 apply the voltage Vg to their blocks. The voltage Ve is, for example, about 5 V. Herein, the voltage Ve may be higher or lower than 5 V.

FIG. 21 shows a block 462 and a local row decoder 464 concerned. The block 462 is any one of the blocks B0 to Bn shown in FIG. 4. The local row decoder 464 may be any one of the local column decoders 432 to 432n. In FIG. 21 are shown only two global word lines 465 and 466 extending through the block 462. The global word lines 465 and 466 are any two of the global word lines 448 to 448n shown in FIG. 20.

The block 462 includes bit lines 480 to 480n. Furthermore, the block 462 includes local word lines corresponding to the global word lines, respectively. For example, a local word line 481 is connected to the global word line 465 via a switching transistor 486 of the local row decoder 464. A local word line 482 is connected to the global word line 466 via a switching transistor 486n of the local row decoder 464. FIG. 21 only shows two local word lines. In actual, the block 462 includes a large number of local word lines.

For example, each of the switching transistors 486 to 486n is a P-channel MOSFET. A negative voltage can pass each of the local word lines during the erasing period of the block 462 by using a P-channel transistor as each of the switching transistors 486 to 486n. Moreover, each of the switching transistors 486 to 486n can be replaced with other switching circuits for enabling negative voltages to pass.

The block 462 includes a common power source line 483 which is connected to one of the erasing switches 436 shown in FIG. 20. Additionally, the block 462 includes memory cells 474 to 474n and 475 to 475n, each of which has a drain connected to the bit line, a gate connected to the local word line and a source connected to the common power source line 483.

As shown in FIG. 21, the local row decoder 464 includes a block selecting circuit 488 in the vicinity of the switching transistors 486 to 486n. Each of the switching transistors 486 to 486n is connected to the block selecting circuit 488 via a line 487. The block selecting circuit 488 receives a block selecting signal Si which is any one of the block selecting signals S0 to Sn transmitted from the block decoder 437 shown in FIG. 20. The-block selecting circuit 488 is connected to a power source voltage Vp and a negative voltage Vn sent from a global negative voltage pump 491 shown in FIG. 22. Table 1 below shows the levels of the voltages Vp and Vn for the reading, writing and erasing processings.

TABLE 1

| | Reading | Writing | | Erasing | |
|---|---|---|---|---|---|
| Si | HIGH | Selection HIGH | Non-selection LOW | Selection HIGH | Non-selection LOW |
| Vp | 2 V | 5 V | | 0 V | |
| Vn | −2 V | −2 V | | −5 V | |
| Vc | −2 V | −2 V | 5 V | −5 V | 0 V |

The block selecting circuit 488 includes a drive circuit and a negative voltage switching control circuit, neither shown. The block selecting circuit 488 is shown in detail in FIG. 24.

The block selecting circuit 488 is operated in response to the block selecting signal Si. When the block selecting circuit 488 receives the signal Si, it turns on the switching transistors 486 to 486n. Unless the block selecting circuit 488 receives the signal Si, it does not turn on the switching transistors 486 to 486n. In one example, negative gate erasure is carried out by applying the negative voltage to each of the gates of the memory cells during the erasing processing period in the block 462. In this manner, each of the local word lines 481 and 482 need be switched to the negative voltage during the erasing period. As shown in FIG. 21, each of the local word lines 481 and 482 is connected to a corresponding one of the global word lines 465 and 466 via one of the switching transistors 486 to 486n. As a consequence, the global word line corresponding to the local word line needs to receive the negative voltage in such a manner as to apply the negative voltage to the corresponding local word line, such that the local word line can receive the negative voltage. Upon this operation, another negative voltage also needs to be switched by the corresponding switching transistor. In this case, the block selecting circuit 488 needs to apply the negative voltage Vn to each of the gates of the switching transistors 486 to 486n during the erasing period in the block 462 in the negative voltage switching control circuit.

When the block 462 is selected for the erasing processing, a block drive circuit of the block selecting circuit 488 is not operated. During this period, the switching control circuit of the block selecting circuit 488 is controlled in response to the signal Si and the erasing signal, and then, a negative voltage Vc is generated in each of the switching transistors 486 to 486n based on the voltage Vn. The negative voltage Vc turns on the transistors 486 to 486n when the global word lines 481 and 482 are connected to a negative voltage. In this manner, the local word lines 481 and 482 are sequentially connected to the negative voltage.

The voltage levels of the signals shown in FIG. 21 are shown in Table 1.

Figure 22:
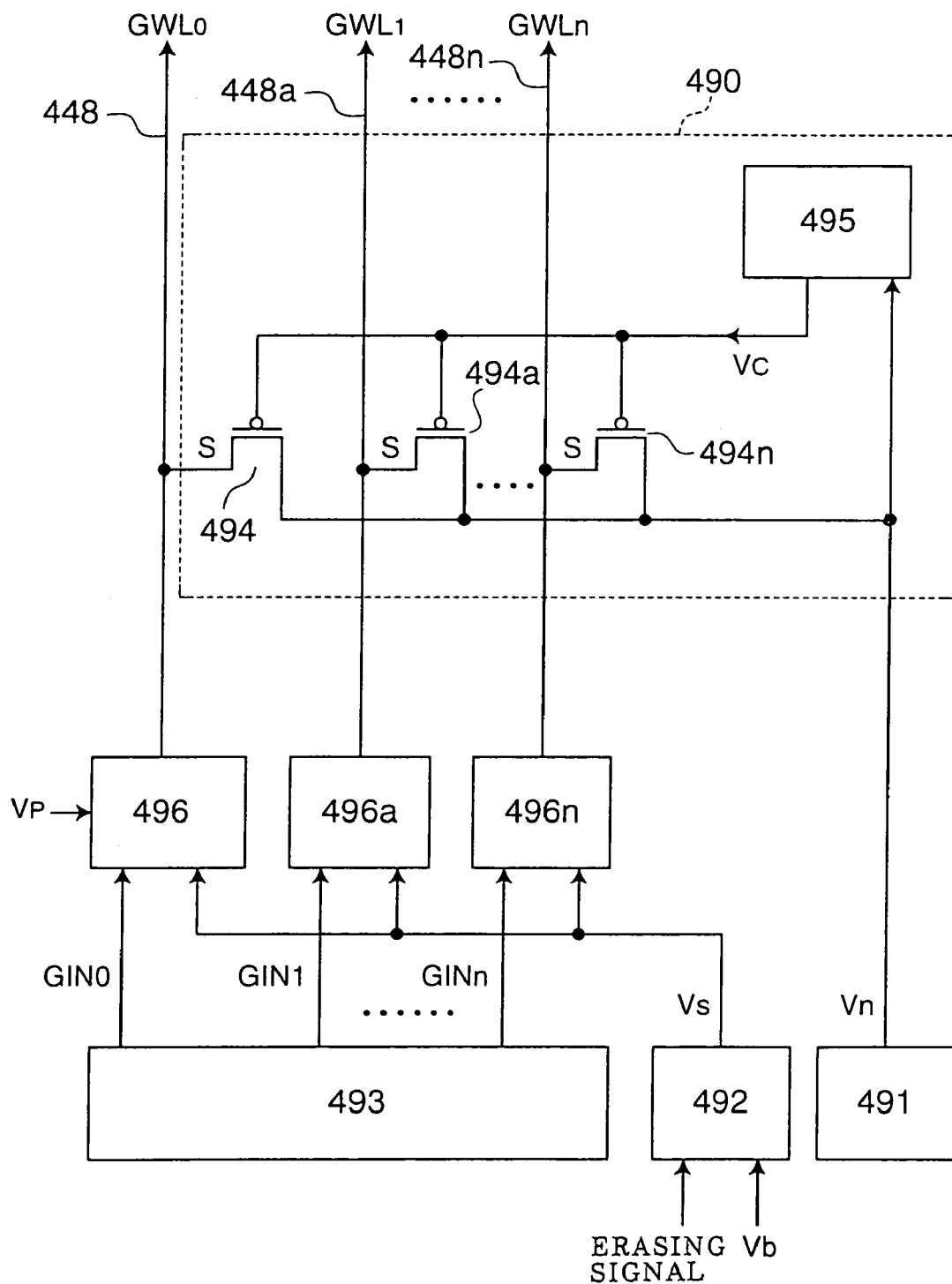
FIG. 22 is a circuit diagram showing a main part of the semiconductor memory device (tenth embodiment) according to an embodiment of the present invention.

FIG. 22 shows the global row decoder 438, shown in FIG. 20, including a negative voltage switching circuit 490 which supplies a negative voltage Vn to the global word lines of the semiconductor memory device 430, thereby achieving the negative gate erasure. As shown in FIG. 22, the global row decoder 438 includes an address decoder 493 connected to a plurality of global line drive circuits 496 to 496n. Outputs from the drive circuits 496 to 496n are connected to the global word lines 448 to 448n, respectively. Each of the drive circuits 496 to 496n is controlled in response to an insulating signal Vs transmitted from an insulating control circuit 492. The insulating signal Vs insulates an N-channel transistor in each of the drive circuits 496 to 496n from the negative voltage applied to the global word lines 448 to 448n at the time of enabling, to thus prevent the N-channel transistor in each of the drive circuits 496 to 496n from being broken by the negative voltage. The insulating control circuit 492 outputs the signal Vs during the erasing period of the semiconductor memory device 430. The insulating control circuit 492 will be described later with reference to FIG. 25.

As shown in FIG. 22, the switching circuit 490 includes a plurality of P-channel negative voltage switching transistors 494 to 494n connected to the global word lines 448 to 448n, respectively. Each of-the P-channel switching transistors 494 to 494n of the switching circuit 90 has a source connected to the global word line and a drain connected so as to receive the negative voltage Vn from the global negative voltage pump 491 during the erasing processing period. The global negative voltage pump 491 is constituted of a known voltage pump circuit capable of generating negative voltages. The gate of each of the switching transistors 494 to 494n is connected to a switching control circuit 495 and, thus, is controlled by the switching control circuit 495. The switching control circuit 495 is controlled in response to an array plane selecting signal. The switching control circuit 495 will be described later with reference to FIG. 23.

The erasing signal is outputted during the erasing processing period and, therefore, the signal Vs becomes 0 V. In response to the signal Vs of 0 V, the negative voltage to be applied to the global word line is insulated to be disconnected from an N-channel transistor of each of the drive circuits 496 to 496n. In the meantime, the switching control circuit 495 applies the negative voltage Vc (i.e., about −5 V) to the gate of each of the switching transistors 494 to 494n and, thus, turns on each of the switching transistors 494 to 494n. Consequently, the negative voltage Vn is applied in sequence to each of the global word lines 448 to 448n. As described above, in order to allow a P-channel transistor to pass the global negative voltage, another negative voltage need to be applied to the gate of the P-channel transistor.

During a non-erasing (i.e., reading or writing) processing period, the global negative voltage pump 491 applies a positive voltage Vn to the transistors 494 to 494n, and then, the switching control circuit 495 turns the voltage Vc to a positive level. In this manner, the transistors 494 to 494n are sequentially turned off, so that the global negative voltage switching circuit 490 is insulated from the global word lines 448 to 448n during the non-erasing processing period.

The voltage levels of the signals shown in FIG. 22 are shown in Table 2.

TABLE 2

|  | Reading | Writing | Erasing Selection | Erasing Non-selection |
|---|---|---|---|---|
| Vs | −2 V | −2 V |  | 0 V |
| Vp | 2 V | 5 V |  | 0 V |
| Vh | 2 V | 5 V |  | −5 V |
| Vc | 2 V | 5 V | −5 V | 0 V |
| Erasing signal | LOW | LOW |  | HIGH |

Figure 23:
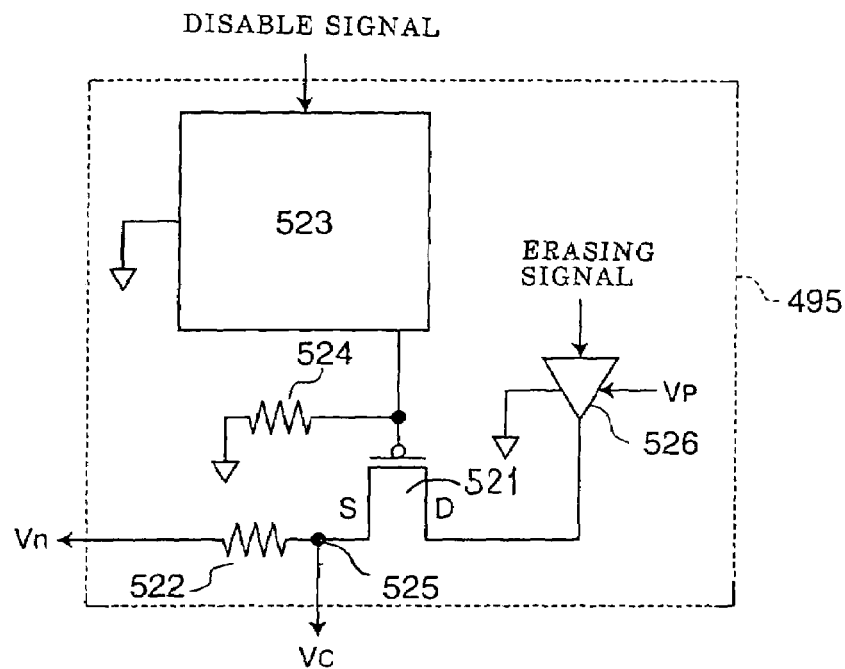
FIG. 23 is a circuit diagram showing a main part of the semiconductor memory device (tenth embodiment) according to an embodiment of the present invention.

FIG. 23 shows the detail of the switching control circuit 495 shown in FIG. 22. As shown in FIG. 23, the switching control circuit 495 has a source connected to an output node 525 and a drain connected so as to selectively receive a voltage Vp or a ground voltage. The voltage Vp is about 2 V when the semiconductor memory device 430 (FIG. 20) performs the reading processing, and is about 5 V when the semiconductor memory device 430 (FIG. 20) performs the writing processing. A transistor 521 may be a transistor of other types.

The transistor 521 functions in such a manner as to allow either one of the voltage Vp and the ground voltage to pass the node 525 when the transistor 521 is turned on. A gate of the transistor 521 is grounded via a resistor 524. Furthermore, the gate of the transistor 521 is connected to a negative voltage pump 523. The negative voltage pump 523 is a small-sized 1-stage negative voltage pump, which generates the negative voltage in a not-disable state so as to turn on the transistor 521 when the ground voltage is applied to the-drain of the transistor 521. As a consequence, the node 525 is connected to the ground voltage. For example, the disable signal for the negative voltage pump 523 can serve as the block selecting signal for the block or a plane selecting signal for the semiconductor memory device 430. The fact that the semiconductor memory device includes the plane selecting signal denotes that the memory array 431 (FIG. 20) is arranged on two or more planes.

Moreover, the control circuit 495 also includes the node 525 and the negative-voltage pump 491 shown in FIG. 22. For example, each of the resistor 522 and the resistor 524 may be a polysilicon resistor.

The resistor 524 grounds the gate of the transistor 521 when the negative voltage pump 523 is OFF. Furthermore, the application of the voltage Vp to the transistor 521 is controlled in response to the erasing signal. During the non-erasing processing period, no erasing signal is outputted, so that the voltage Vp in the drive circuit 526 is applied to the drain of the transistor 521. At this time, the negative voltage pump 523 is not turned on, and thus, the gate of the transistor 521 receives the ground voltage. Consequently, the transistor 521 is turned on, and then, the positive voltage Vp is applied to the node 525. As a result, the voltage Vc of the node 525 forcibly becomes the positive voltage Vp even when the negative voltage Vn is applied to the resistance 522 all the time. Herein, the resistor 522 separates the negative voltage Vn from the node 525. When the voltage Vc is the voltage Vp, the switching transistors (for example, the transistors 494 to 494n shown in FIG. 22) are turned off.

During the erasing processing period, the erasing signal is outputted, so that the drain of the transistor 521 is connected to the ground voltage. At this time, the pump 523 is turned on in the case where the block or memory plane relative to the control circuit 520 is not a block or memory plane selected for the erasing processing. Consequently, the transistor 521 is turned on, and thus, the ground voltage is connected to the node 525. Thus, the voltage Vc becomes the ground voltage, so that all of the switching transistors (for example, the transistors 494 to 494n shown in FIG. 22) are turned off.

However, in the case where the memory plane relative to the control circuit 495 is a selected block or memory plane, the pump 523 is turned off in response to the disable signal. As a result, the transistor 521 is turned off. In the meantime, the resistor 522 applies the negative voltage Vn to the node 525, so that the voltage Vc becomes the negative voltage Vn. When the voltage Vc becomes the negative voltage Vn, the switching transistors (for example, the transistors 494 to 494n shown in FIG. 22) are turned on, and thus, the negative voltage Vn is connected to the global word lines.

Figure 24:
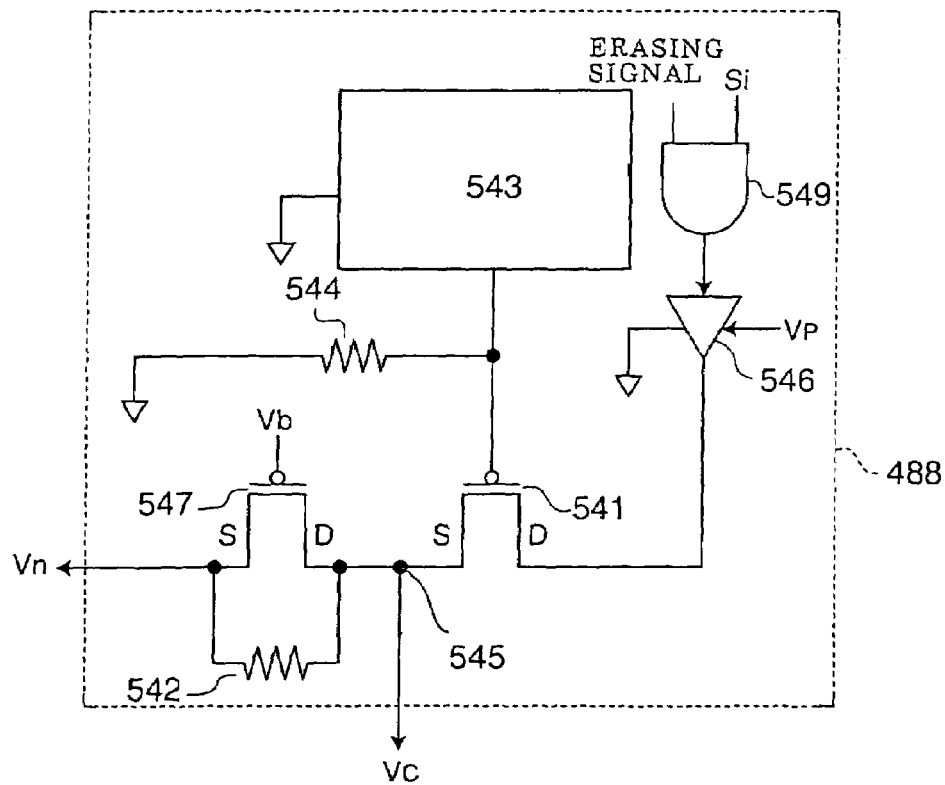
FIG. 24 is a circuit diagram showing a main part of the semiconductor memory device (tenth embodiment) according to an embodiment of the present invention.

FIG. 24 shows the block selecting circuit 488 shown in FIG. 21. As shown in FIGS. 23 and 24, the circuit 488 shown in FIG. 24 is basically identical to the circuit 495 shown in FIG. 23 except for a transistor 547 shown in FIG. 24. As shown in FIG. 24, a drive circuit 546 is of the block selecting circuit. As is clear from FIG. 24, the P-channel transistor 547 which is connected to a resistor 542 in parallel, is a bypass transistor. Therefore, when the transistor 547 is turned on in response to a bypass signal Vb, the transistor 547 causes a node 545 to bypass the resister 542 and to be directly connected to the global negative voltage pump 491 shown in FIG. 22. In this manner, the node 545 can be speedily charged during the rising and writing processing period. The bypassing is controlled in response to the signal Vb generated by other circuits (not shown) of the semiconductor memory device 430.

Figure 25:
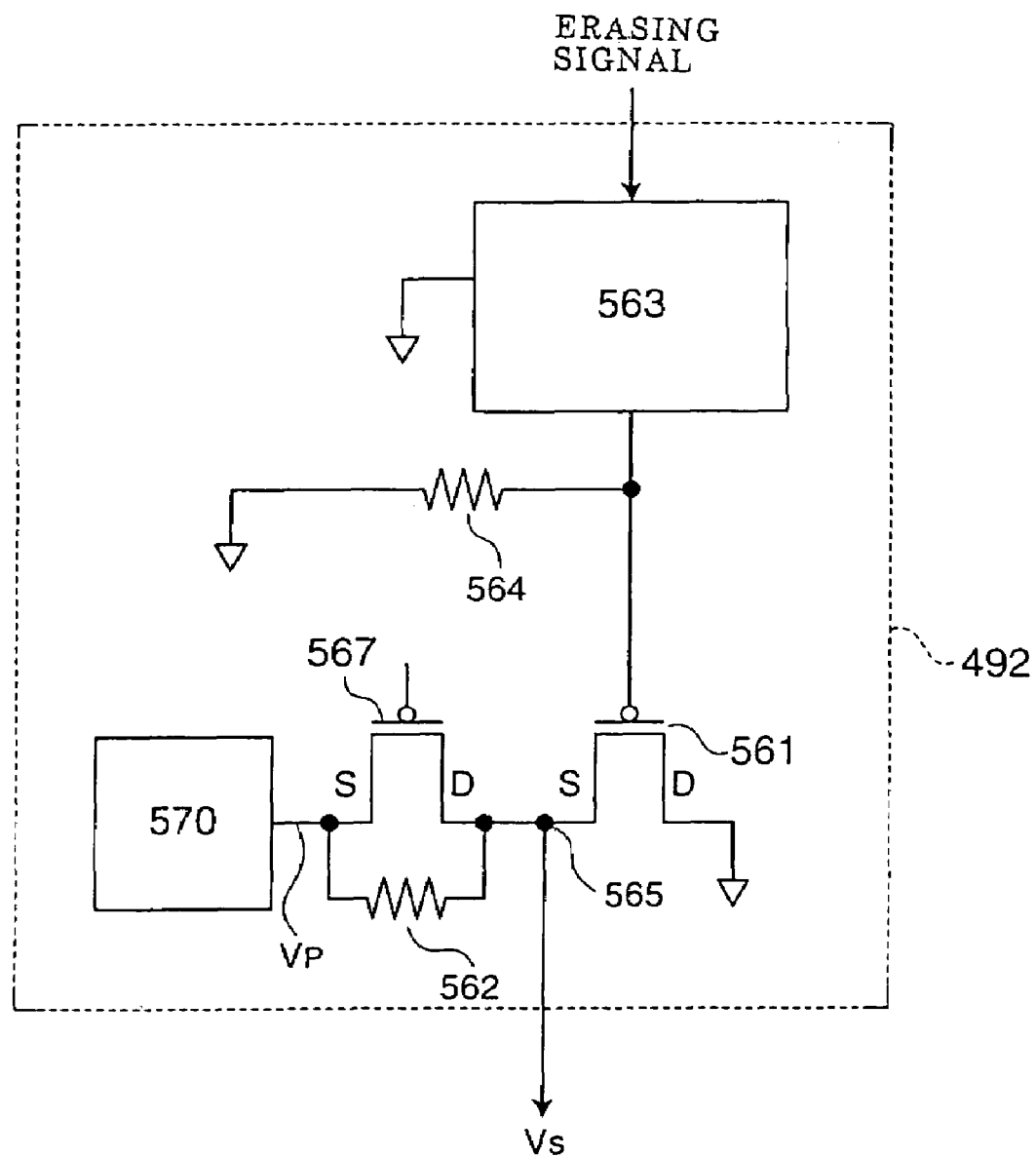
FIG. 25 is a circuit diagram showing a main part of the semiconductor memory device (tenth embodiment) according to an embodiment of the present invention.

FIG. 25 shows the insulating control circuit 492 shown in FIG. 22. As shown in FIGS. 24 and 25, the insulating control circuit 492 shown in FIG. 25 is basically identical to the circuit 488 shown in FIG. 24 except that the transistor 561 has a drain grounded all the time. In this manner, a voltage Vs becomes equal to a voltage Vp supplied from a negative voltage pump 570 during the non-erasing processing period. Since a pump 563 is turned on in response to an erasing signal during the erasing processing period, the transistor 561 is turned on. Consequently, the voltage Vs becomes a ground voltage. The negative voltage pump 570 causes the voltage Vp to be at about −2 V during an actual processing period; at about −2 V during the writing processing period;

and at about −5 V during the erasing processing period. Table 3 shows voltages of the signals shown in FIG. 25.

TABLE 3

|    | Reading | Writing | Erasing |
|----|---------|---------|---------|
| Vp | −2 V    | −2 V    | −5 V    |
| Vs | −2 V    | −2 V    | 0 V     |

Eleventh Embodiment

Figure 26:
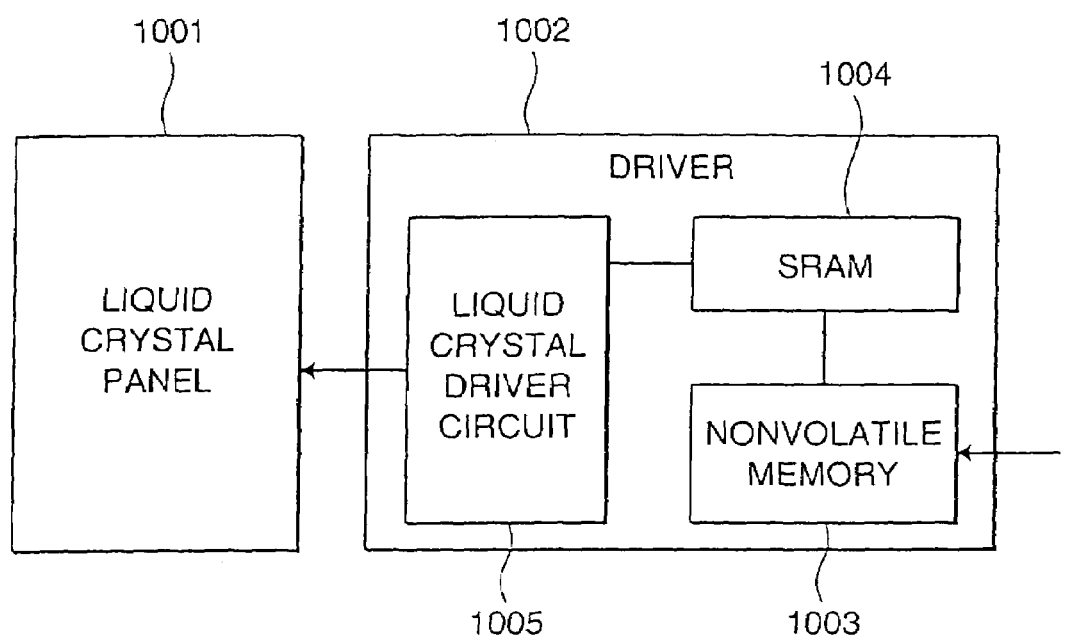
FIG. 26 is a schematic configuration diagram showing a liquid crystal display device (eleventh embodiment) incorporating therein a semiconductor memory device according to an embodiment of the present invention.

As an application example of the semiconductor memory device, for example, as shown in FIG. 26, a rewritable nonvolatile memory for image adjustment of a liquid crystal panel can be mentioned.

A liquid crystal panel 1001 is driven by a liquid crystal driver 1002. In the liquid crystal driver 1002, a nonvolatile memory 1003, an SRAM 1004 and a liquid crystal driver circuit 1005 are provided. The nonvolatile memory 1003 is constructed by the memory cell of the present invention, more preferably, any of the semiconductor memory devices of the first to ninth embodiments. The nonvolatile memory 1003 can be rewritten from the outside.

Information stored in the nonvolatile memory 1003 is transferred to the SRAM 1004 at the time of turn-on of the power source of an apparatus. The liquid crystal driver circuit 1005 can read stored information from the SRAM 1004 as necessary. By providing the SRAM, high reading speed of stored information can be achieved.

The liquid crystal driver 1002 may be externally attached to the liquid crystal panel 1001 as shown in FIG. 26 or formed on the liquid crystal panel 1001.

In a liquid crystal panel, tones displayed by applying voltages in multiple grades to pixels are changed. The relation between the given voltage and the displayed tone varies according to products. Consequently, information for correcting variations in each product after completion of the product is stored and correction is made on the basis of the information, thereby enabling the picture qualities of products to be made uniform. It is therefore preferable to mound a rewritable nonvolatile memory for storing correction information. As the nonvolatile memory, it is preferable to use the memory cell of the present invention. Particularly, it is preferable to use any of the semiconductor memory devices of the first to ninth embodiments in which memory cells of the present invention are integrated.

Twelfth Embodiment

FIG. 27 shows a portable telephone as a portable electronic apparatus in which the semiconductor memory device is assembled.

The portable telephone is constructed mainly by a control circuit 811, a battery 812, an RF (radio frequency) circuit 813, a display 814, an antenna 815, a signal line 816, a power source line 817 and the like. In the control circuit 811, the semiconductor memory device of an embodiment of the present invention is assembled. The control circuit 811 is preferably an integrated circuit using cells having the same structure as a memory circuit cell and a logic circuit cell as described in the tenth embodiment. It facilitates fabrication of the integrated circuit, and the manufacturing cost of the portable electronic apparatus can be particularly reduced.

By using the semiconductor memory device capable of performing high-speed reading operation and whose process of mounting a memory part and a logic circuit part simultaneously is easy for a portable electronic apparatus, the operation speed of the portable electronic apparatus is increased, and the manufacturing cost can be reduced. Thus, a cheap, high-reliability, and high-performance portable electronic apparatus can be obtained.

Since the erasing processing in the memory cell can be performed by using the negative gate voltage in the semiconductor memory device according to an embodiment of the present invention, it is possible to reduce the number of devices and save the electric power consumed by the device.

Furthermore, since the memory cell includes the gate electrode formed on the semiconductor layer via the gate insulating film, the channel region disposed under the gate electrode, the diffusion regions disposed on both sides of the channel region and having the conductive type opposite to that of the channel region, and the memory functional units formed on both sides of the gate electrode and having the function of retaining charges, the process for forming the memory cell has very high affinity with the process for forming a normal transistor. Therefore, it is possible to remarkably reduce the number of masks and the number of processes in comparison with the case of the combination with a peripheral circuit consisting of the normal transistor by using a conventional flash memory as a nonvolatile memory cell. Thus, it is possible to enhance the yield of the chip and reduce the cost.

Since the memory cell includes the gate electrode formed on the semiconductor layer via the gate insulating film, the channel region disposed under the gate electrode, the diffusion regions disposed on both sides of the channel region, and the memory functional units formed on both sides of the gate electrode and having the function of retaining charges, it is possible to readily reduce the thickness of the gate insulating film and, further, to carry out the erasure at the negative voltage having an absolute value smaller than that in the prior art.

At least a part of the memory functional unit included in the memory cell overlaps with a part of the diffusion region, and therefore, the erasure can be carried out at the negative voltage having an absolute value smaller than that in the prior art.

The memory cell includes the insulating film for separating the film having the surface substantially in parallel to the surface of the gate insulating film and the function of retaining charges from the channel region or the semiconductor layer, wherein the insulating film is thinner than the gate insulating film and is 0.8 nm or more. Thus, the charges can be readily injected into the memory functional unit, and therefore, the erasure can be carried out at the negative voltage having an absolute value smaller than that in the prior art.

In this manner, since the erasure can be carried out in the above-described memory cell by applying, to the gate electrode, the negative voltage having an absolute value smaller than that in the conventional flash memory, it is unnecessary to design a portion to be applied with a high voltage according to a greater design rule so as to enhance a high voltage durability, unlike in the prior art, and therefore, it is possible to use the transistor having a short gate length. Furthermore, it is possible to remarkably reduce the capacitor area of the pump circuit. Consequently, the negative voltage switching circuit can be achieved at an area smaller than that in the prior art. Moreover, the driving can be implemented at the voltage having a small absolute value, and further, the size of the transistor constituting the circuit or the capacitor area can be reduced more than in the prior art. Thus, it is possible to remarkably save the electric power consumed by electrically charging or discharging the negative voltage switching circuit.

Additionally, since the electronic apparatus, in particular, the portable electronic apparatus according to an embodiment of the present invention includes the above-described semiconductor memory device, it is possible to facilitate the combination process of the memory and the logic circuit, so as to increase the operating speed of the electronic apparatus, reduce the fabricating cost, and provide a display device of high reliability at a reduced cost.

What is claimed is:

1. A semiconductor memory device, comprising:
    a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode, each memory function unit having a retaining region for retaining charges, at least a part of the retaining region existing over one of the diffusion regions;
    a switching transistor circuit including a negative voltage switching circuit for applying a negative voltage to the gate electrode of the memory cell, and a switching transistor connected to an output of the negative voltage switching circuit and a first voltage source for outputting a voltage having a voltage level lower than zero volt;
    a pull-up circuit connected to a control terminal of the switching transistor and selectively connected to a second voltage source for outputting a voltage having a voltage level higher than zero volt; and
    a pull-down circuit connected to the first voltage source and the control terminal of the switching transistor, wherein
    the pull-up circuit is configured in such a manner as to connect the second voltage source to the control terminal of the switching transistor when the pull-up circuit is connected to the second voltage source and the switching transistor does not connect the first voltage source to the output of the negative voltage switching circuit, and the pull-down circuit is configured in such a manner as to connect the first voltage source to the control terminal of the switching transistor when the pull-up circuit is not connected to the second voltage source and the switching transistor connects the first voltage source to the output of the negative voltage switching circuit.

2. The semiconductor memory device according to claim 1, wherein the first voltage source outputs a voltage of −1 to −6 V, and the second voltage source outputs a voltage of 1 to 6 V.

3. The semiconductor memory device according to claim 1, wherein the switching transistor is a P-channel transistor.

4. The semiconductor memory device according to claim 1, wherein the pull-up circuit includes:
    a first transistor having a first terminal connected to the control terminal of the switching transistor and a second terminal selectively connected to the second voltage source and ground;
    a voltage pump, connected to a control terminal of the first transistor, for applying a third voltage having a voltage level lower than zero volt to the control terminal of the first transistor; and
    a first resistor, connected to ground, the voltage pump and the control terminal of the first transistor, for connecting ground to the control terminal of the first transistor when the voltage pump does not apply the third voltage to the control terminal of the first transistor, wherein
    the first transistor is turned off when the first terminal and the control terminal of the first transistor are grounded, so that the pull-down circuit connects the first voltage source to the control terminal of the switching transistor.

5. The semiconductor memory device according to claim 4, wherein the pull-up circuit further includes a switching circuit for connecting a second voltage to the second terminal of the first transistor under control of a control signal.

6. The semiconductor memory device according to claim 4, wherein the first transistor is a P-channel transistor, and the first resistor is a polysilicon resistor.

7. The semiconductor memory device according to claim 1, wherein the pull-down circuit further includes:
    a second resistor connected to the first voltage source and the control terminal of the switching transistor; and
    a second transistor, connected in parallel to the second resistor and connected to the control terminal of the switching transistor and the first voltage source, for allowing the first voltage source to bypass the second resistor of the pull-down circuit when turned on.

8. The semiconductor memory device according to claim 7, wherein the second transistor is a P-channel transistor, and the second resistor is a polysilicon resistor.

9. The semiconductor memory device according to claim 1, wherein
    the memory cell includes a film having a surface substantially in parallel to a surface of the gate insulating film for retaining charges, and an insulating film for separating the film from the channel region or the semiconductor layer, wherein the insulating film has a thickness thinner than the gate insulating film and not thinner than 0.8 nm.

10. The semiconductor memory device according to claim 1, wherein
    at least a part of the memory functional unit included in the memory cell overlaps a part of the diffusion region.

11. A portable electronic apparatus, comprising:
    the semiconductor memory device according to claim 1.

12. A semiconductor memory device, comprising:
    a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode, each memory function unit having a retaining region for retaining charges, at least a part of the retaining region existing over one of the diffusion regions;
    a word line connected to the gate electrode of the memory cell; and
    a negative voltage switching circuit, connected to the word line, for connecting a first voltage having a voltage level lower than zero volt to the gate electrode of the memory cell during an erasing period of the memory cell, wherein
    the negative voltage switching circuit includes:
    a switching transistor connected to the word line and a first voltage source;
    a pull-up circuit, connected to a control terminal of the switching transistor and selectively connected to a second voltage source having a voltage level higher than zero volt, for connecting the second voltage source to a control terminal of the switching transistor when the pull-up circuit is connected to the second voltage source such that the switching transistor does not connect the first voltage source to the gate electrode of the memory cell via the word line; and a pull-down circuit, connected to the first voltage source and the control terminal of the switching transistor, for connecting the first voltage source to the control terminal of the switching transistor when the pull-up circuit is not connected to the second voltage source such that the switching transistor connects the first voltage source to the memory cell via the word line.

13. The semiconductor memory device according to claim 12, wherein the first voltage source outputs a voltage of −1 to −6 V, and the second voltage source outputs a voltage 1 to 6 V.

14. The semiconductor memory device according to claim 12, wherein the switching transistor is a P-channel transistor.

15. The semiconductor memory device according to claim 12, wherein the pull-up circuit includes:
a first transistor having a first terminal connected to the control terminal of the switching transistor and a second terminal selectively connected to the second voltage source and ground;
a voltage pump, connected to a control terminal of the first transistor, for applying a third voltage having a voltage level lower than zero volt, to the control terminal of the first transistor; and
a first resistor, connected to ground, the voltage pump and the control terminal of the first transistor, for connecting ground to the control terminal of the first transistor when the voltage pump does not apply the third voltage to the control terminal of the first transistor, wherein
the first transistor is turned off when the first terminal and the control terminal of the first transistor are grounded, so that the pull-down circuit connects the first voltage source to the control terminal of the switching transistor.

16. The semiconductor memory device according to claim 15, wherein the pull-up circuit further includes a switching circuit for connecting a second voltage to the second terminal of the first transistor under control of a control signal.

17. The semiconductor memory device according to claim 15, wherein the first transistor is a P-channel transistor, and the first resistor is a polysilicon resistor.

18. The semiconductor memory device according to claim 12, wherein the pull-down circuit further includes:
a second resistor connected to the first voltage source and the control terminal of the switching transistor; and
a second transistor, connected in parallel to the second resistor and connected to the control terminal of the switching transistor and the first voltage source, for allowing the first voltage source to bypass the second resistor of the pull-down circuit when turned-on.

19. The semiconductor memory device according to claim 18, wherein the second transistor is a P-channel transistor, and the second resistor is a polysilicon resistor.

20. A semiconductor memory device, comprising:
a memory cell including a gate electrode formed on a semiconductor layer via a gate insulating film, a channel region disposed under the gate electrode, diffusion regions disposed on both sides of the channel region and having a conductive type opposite to that of the channel region, and memory functional units formed on both sides of the gate electrode, each memory function unit having a retaining region for retaining charges, at least a part of the retaining region existing over one of the diffusion regions;
a voltage switching circuit for applying a voltage to the gate electrode of the memory cell;
a switching transistor connected to an output of the voltage switching circuit and a first voltage source having a voltage level lower than zero volt;
a first transistor, connected to a control terminal of the switching transistor and selectively connected to a second voltage source having a voltage level higher than zero volt, for connecting the second voltage source to the control terminal of the switching transistor when the switching transistor is connected to the second voltage source such that the switching transistor does not connect the first voltage source to the output; and
a first resistor, connected to the first voltage source and the control terminal of the switching transistor, for connecting the first voltage source to the control terminal of the switching transistor when the switching transistor is not connected to the second voltage source such that the switching transistor connects the first voltage source to the output.

21. The semiconductor memory device according to claim 20, further composing:
a second resistor connected to ground and the control terminal of the first transistor; and
a voltage pump, connected to the control terminal of the first transistor, for applying a third voltage having a voltage level lower than zero volt to the control terminal of the first transistor, wherein
the second resistor allows the control terminal to be grounded when the voltage pump does not apply the third voltage to the control terminal of the first transistor.

22. The semiconductor memory device according to claim 21, further comprising:
a second transistor connected in parallel to the first resistor and connected to the switching transistor and the first voltage source, wherein
the second transistor allows the first voltage source to bypass the first resistor when turned-on.

23. The semiconductor memory device according to claim 22, wherein
each of the first and second resistors is a polysilicon resistor, each of the first and second transistors is a P-channel transistor, and the switching transistor is a P-channel transistor.

24. The semiconductor memory device according to claim 23, further comprising:
a switching circuit for connecting the second voltage source to the first transistor under control of a control signal.

* * * * *